(12) United States Patent
Shatalov et al.

(10) Patent No.: US 10,199,537 B2
(45) Date of Patent: *Feb. 5, 2019

(54) SEMICONDUCTOR STRUCTURE WITH STRESS-REDUCING BUFFER STRUCTURE

(71) Applicant: Sensor Electronic Technology, Inc., Columbia, SC (US)

(72) Inventors: Maxim S. Shatalov, Columbia, SC (US); Jinwei Yang, Columbia, SC (US); Alexander Dobrinsky, Silver Spring, MD (US); Michael Shur, Vienna, VA (US); Remigijus Gaska, Columbia, SC (US)

(73) Assignee: Sensor Electronic Technology, Inc., Columbia, SC (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/856,920

(22) Filed: Dec. 28, 2017

(65) Prior Publication Data

US 2018/0122987 A1    May 3, 2018

Related U.S. Application Data

(63) Continuation of application No. 15/391,994, filed on Dec. 28, 2016, which is a continuation-in-part of (Continued)

(51) Int. Cl.
*H01L 33/02* (2010.01)
*H01L 33/62* (2010.01)
(Continued)

(52) U.S. Cl.
CPC ............ *H01L 33/12* (2013.01); *C30B 29/403* (2013.01); *G06F 17/505* (2013.01);
(Continued)

(58) Field of Classification Search
None
See application file for complete search history.

(56) References Cited

U.S. PATENT DOCUMENTS 6,121,121 A    9/2000    Koide
6,184,144 B1   2/2001    Lo
(Continued)

FOREIGN PATENT DOCUMENTS

CN     102651436 A      8/2012
JP     2010-251738     11/2010
JP     4945725 B2       6/2012

OTHER PUBLICATIONS

Al Tahtamouni, T.M. et al., "Effects of double layer AlN buffer layers on properties of Si-doped AlxGa1-xN for improved performance of deep ultraviolet light emitting diodes," 2013, Journal of Applied Physics, vol. 113, No. 123501.
(Continued)

*Primary Examiner* — Alexander Ghyka
(74) *Attorney, Agent, or Firm* — LaBatt, LLC

(57) ABSTRACT

A semiconductor structure comprising a buffer structure and a set of semiconductor layers formed adjacent to a first side of the buffer structure is provided. The buffer structure can have an effective lattice constant and a thickness such that an overall stress in the set of semiconductor layers at room temperature is compressive and is in a range between approximately 0.1 GPa and 2.0 GPa. The buffer structure can be grown using a set of growth parameters selected to achieve the target effective lattice constant a, control stresses present during growth of the buffer structure, and/or control stresses present after the semiconductor structure has cooled.

20 Claims, 13 Drawing Sheets

Related U.S. Application Data application No. 15/230,933, filed on Aug. 8, 2016, now Pat. No. 9,876,140, which is a continuation of application No. 14/628,281, filed on Feb. 22, 2015, now Pat. No. 9,412,902.

(60) Provisional application No. 61/943,365, filed on Feb. 22, 2014.

(51) Int. Cl.

| | |
|---|---|
| *H01L 33/12* | (2010.01) |
| *H01L 33/32* | (2010.01) |
| *H01L 33/06* | (2010.01) |
| *H01L 33/46* | (2010.01) |
| *H01L 33/00* | (2010.01) |
| *C30B 29/40* | (2006.01) |
| *G06F 17/50* | (2006.01) |
| *H01L 33/14* | (2010.01) |
| *H01L 33/40* | (2010.01) |

(52) U.S. Cl.
CPC .......... *H01L 33/007* (2013.01); *H01L 33/06* (2013.01); *H01L 33/32* (2013.01); *H01L 33/46* (2013.01); *H01L 33/0075* (2013.01); *H01L 33/145* (2013.01); *H01L 33/405* (2013.01)

(56) References Cited

U.S. PATENT DOCUMENTS

| | | |
|---|---|---|
| 6,844,569 B1 | 1/2005 | Lee et al. |
| 6,946,682 B2 | 9/2005 | Slater, Jr. et al. |
| 7,326,963 B2 | 2/2008 | Gaska et al. |
| 7,776,636 B2 | 8/2010 | Wang |
| 7,872,268 B2 | 1/2011 | Emerson |
| 8,633,468 B2 | 1/2014 | Gaska et al. |
| 9,330,906 B2 | 5/2016 | Shatalov et al. |
| 9,412,902 B2 | 8/2016 | Shatalov et al. |
| 2001/0035531 A1 | 11/2001 | Kano et al. |
| 2004/0219702 A1 | 11/2004 | Nagai et al. |
| 2005/0236633 A1 | 10/2005 | Emerson |
| 2007/0085097 A1 | 4/2007 | Kim et al. |
| 2008/0054248 A1 | 3/2008 | Chua et al. |
| 2008/0153191 A1 | 6/2008 | Grillot et al. |
| 2009/0001416 A1 | 1/2009 | Chua et al. |
| 2009/0008647 A1 | 1/2009 | Li et al. |
| 2009/0072262 A1 | 3/2009 | Iza et al. |
| 2009/0091002 A1 | 4/2009 | Arena et al. |
| 2009/0200645 A1 | 8/2009 | Kokawa et al. |
| 2011/0001127 A1 | 1/2011 | Sakamoto et al. |
| 2011/0244663 A1 | 10/2011 | Su |
| 2012/0217538 A1 | 8/2012 | Jin et al. |
| 2014/0110754 A1 | 4/2014 | Jain et al. |
| 2016/0343904 A1 | 11/2016 | Shatalov et al. |
| 2017/0110628 A1 | 4/2017 | Shatalov et al. |

OTHER PUBLICATIONS

Hultman, "Self-Organized Nanostructuring in Hard Nitride Thin Films," Sep. 9-13, 2013 available at http://www.ivc19.com/fileadmin/document/Abstracts/Hultman_Abstract.pdf at least as early as Apr. 30, 2013.

Kuramochi, E. et al., "Perfect spatial ordering of self-organized InGaAs/AlGaAs box-like structure array on GaAs (311)B substrate with silicon nitride dot array," 1997, Applied Physics Letters, vol. 71, No. 1655-57.

Wang, T. et al., "Fabrication of high performance of AlGaN/GaN-based UV light-emitting diodes," Feb. 1, 2002, Journal of Crystal Growth, vol. 235, No. 1-4, 6 pages.

Ghyka, A., U.S. Appl. No. 15/391,994, Office Action1, dated Nov. 7, 2017, 32 pages.

Ghyka, A., U.S. Appl. No. 15/230,933, Notice of Allowance, dated Sep. 13, 2017, 12 pages.

Ghyka, A., U.S. Appl. No. 15/230,933, Final Office Action1, dated Apr. 24, 2017, 12 pages.

Ghyka, A., U.S. Appl. No. 15/230,933, Office Action1, dated Sep. 9, 2016, 17 pages.

Ghyka, A., U.S. Appl. No. 14/628,281, Notice of Allowance, dated Apr. 7, 2016, 5 pages.

Ghyka, A., U.S. Appl. No. 14/628,281, Offic Action 1, dated Dec. 22, 2015, 17 pages.

Dong Woo, K., Korean Application No. 10-2016-7026182, Office Action 1, dated Jul. 19, 2017, 10 pages.

Park, Hye Lyun, International Application No. PCT/US2015/017161, International Search Report and Written Opinon, dated May 21, 2015, 11 pages.

Fangfang, W., Chinese Application No. 201580015794.1, Office Action (with English translation), dated Jan. 10, 2018, 14 pages.

Dong Woo, K., Korean Application No. 10-2016-7026182, Decision of Refusal (with English translation), dated Jan. 25, 2018, 7 pages.

Dong Woo, K., Korean Application No. 10-2016-7026182, Notice of Allowance (An English translation is not available.), dated Mar. 19, 2018, 3 pages.

Ghyka, A., U.S. Appl. No. 15/391,994, Final Office Action1, dated Jun. 11, 2018, 19 pages.

Ghyka, A., U.S. Appl. No. 15/391,994, Notice of Allowance, dated Sep. 19, 2018, 5 pages.

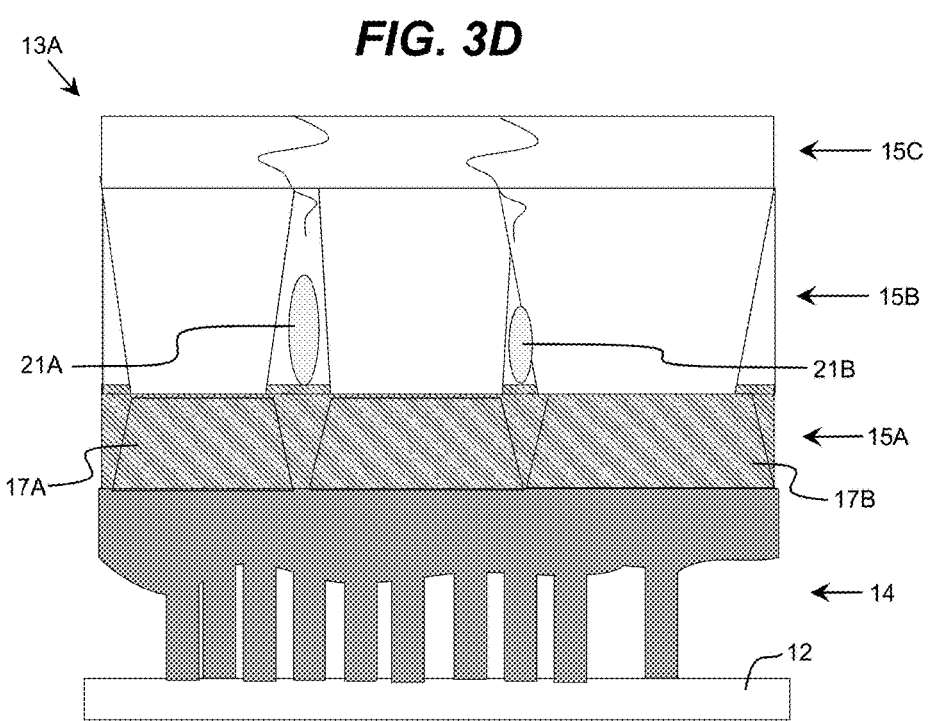

SEMICONDUCTOR STRUCTURE WITH STRESS-REDUCING BUFFER STRUCTURE

REFERENCE TO RELATED APPLICATIONS

The current application is a continuation of U.S. patent application Ser. No. 15/391,994, filed 28 Dec. 2016, which is a continuation-in-part of U.S. patent application Ser. No. 15/230,933, filed on 8 Aug. 2016, which is a continuation of U.S. patent application Ser. No. 14/628,281, filed on 22 Feb. 2015, which claims the benefit of U.S. Provisional Application No. 61/943,365, filed on 22 Feb. 2014, each of which is hereby incorporated by reference.

TECHNICAL FIELD

The disclosure relates generally to semiconductor structures, and more particularly, to a semiconductor structure having an improved buffer structure.

BACKGROUND ART

Group III nitride semiconductors are widely used for fabricating efficient blue and ultraviolet light emitting devices (e.g., diodes, lasers, etc.), ultraviolet detectors, and field effect transistors. Due to a wide band-gap, these materials are a leading choice for fabricating deep ultraviolet light emitting diodes (DUV LEDs). In recent years, significant advances have been made in improving the efficiency of DUV LEDs. However, overall efficiencies of these devices remain low. For fabrication of DUV LEDs, achieving a high quality aluminum nitride (AlN) buffer layer as an underlying layer can be important for the subsequent growth of any Al-rich group III nitride semiconductor layers. However, growth of an AlN layer with high crystal quality on substrates formed of sapphire, silicon carbide (SiC) and silicon, which are currently the main substrates for growth of group III nitride devices, is extremely difficult.

For light emitting devices, such as light emitting diodes (LEDs) and especially deep ultraviolet LEDs (DUV LEDs), minimizing a dislocation density and a number of cracks in the semiconductor layers increases the efficiency of the device. In addition, it can lead to increased reliability of the device. To this extent, several approaches have sought to grow low-defect semiconductor layers on patterned substrates. These approaches typically rely on reducing stresses present in epitaxially grown semiconductor layers.

For example, one approach to reduce stress accumulation in an epitaxially grown layer relies on patterning the underlying substrate using microchannel epitaxy (MCE). Using MCE, a narrow channel is used as a nucleation center containing low defect information from the substrate. An opening in a mask acts as a microchannel, which transfers crystal information to the overgrown layer, while the mask prevents dislocations from transferring to the overgrown layer. As a result, the overgrown layer can become dislocation free. The three-dimensional structure of the MCE also provides another advantage to stress release. The residual stress can be released effectively since the overgrown layer easily deforms. In another approach, a mask is applied at a location of a large concentration of dislocation densities to block their further propagation.

Other approaches rely on epitaxially growing a group III nitride based semiconductor superlattice. A superlattice structure mitigates the strain difference between an aluminum nitride (AlN)/sapphire template and the subsequent thick $Al_xGa_{1-x}N$ (where $0 \leq x \leq 1$) layers. For devices such as DUV LEDs, thick AlGaN epitaxial layers (e.g., on the order of a few micrometers) are desirable to reduce current crowding. Using a superlattice approach, an AlN/AlGaN superlattice was grown to reduce biaxial tensile strain and a 3.0 μm-thick $Al_{0.2}Ga_{0.8}N$ was achieved on sapphire without any cracks. Such a superlattice can be used to minimize the dislocation density due to varying stresses in the sub-layers of the superlattice elements.

While the superlattice approaches allow some control of tensile and compressive stresses in epitaxially grown nitride semiconductor layers, the approaches do not enable epitaxial growth of nitride based semiconductor layers with uniform composition. Based on previous experience obtained from gallium nitride (GaN) growth, lateral epitaxial overgrowth (LEO) has proven an efficient way for significant reduction of dislocation in GaN films. Several other technologies evolved from LEO, such as pendeo-epitaxial, cantilever epitaxy, and facet controlled LEO, have also been developed. While the above approaches work well for epitaxial growth of GaN semiconductor layers, epitaxial growth of aluminum nitride (AlN) layers is more challenging due to a relatively small lateral growth of AlN films.

Another leading approach includes growth of AlN films over patterned substrates, such as, for example, patterned sapphire substrate (PSS). While the PSS-based approach generally produces an AlN layer with reduced stress and low dislocation densities, the patterning process and subsequent growth of AlN films is technologically complicated and costly.

SUMMARY OF THE INVENTION

Aspects of the invention provide a semiconductor structure comprising a buffer structure and a set of semiconductor layers formed adjacent to a first side of the buffer structure. The buffer structure can have an effective lattice constant and a thickness such that an overall stress in the set of semiconductor layers at room temperature is compressive and is in a range between approximately 0.1 gigapascal (GPa) and 2.0 GPa. The buffer structure can be grown using a set of growth parameters selected to achieve the target effective lattice constant a, control stresses present during growth of the buffer structure, and/or control stresses present after the semiconductor structure has cooled.

A first aspect of the invention provides a semiconductor structure comprising: a buffer structure; and a set of semiconductor layers formed adjacent to a first side of the buffer structure, wherein the buffer structure has an effective lattice constant and a thickness such that an overall stress in the set of semiconductor layers at room temperature is compressive and is in a range between approximately 0.1 GPa and 2.0 GPa.

A second aspect of the invention provides a method of fabricating a semiconductor structure, the method including: selecting a set of growth parameters for growing a buffer structure, wherein the set of growth parameters are configured to achieve a target effective lattice constant a for the buffer structure; growing the buffer structure using the selected set of growth parameters; and growing a set of semiconductor layers on the buffer structure, wherein the target effective lattice constant a causes an overall stress in the set of semiconductor layers at room temperature to be compressive and in a range between approximately 0.1 GPa and approximately 2.0 GPa.

A third aspect of the invention provides a method of fabricating a semiconductor device, the method including: fabricating a semiconductor heterostructure for the semiconductor device, the fabricating including: growing a buffer layer directly on a substrate using a multi-stage process, wherein the multi-stage process includes: growing a plurality of nucleation islands formed of a group III nitride material on the substrate using a V/III ratio configured to form relatively small islands and a growth duration selected to increase a density of the plurality of nucleation islands, wherein the V/III ratio is in a range between approximately 100 to approximately 50000, and wherein the duration is in a range of approximately one minute to approximately twenty minutes; inducing vertical growth of the plurality of nucleation islands using an increased growth temperature; and coalescing the plurality of nucleation islands into a single layer using a high growth temperature, wherein the single layer is grown to a thickness in a range of approximately 100 Angstroms to approximately 100 microns; and growing a set of group III nitride semiconductor layers on the buffer layer, wherein an overall stress in the set of group III nitride semiconductor layers at room temperature is compressive and in a range between approximately 0.1 GPa and approximately 2.0 GPa.

The illustrative aspects of the invention are designed to solve one or more of the problems herein described and/or one or more other problems not discussed.

BRIEF DESCRIPTION OF THE DRAWINGS

These and other features of the disclosure will be more readily understood from the following detailed description of the various aspects of the invention taken in conjunction with the accompanying drawings that depict various aspects of the invention.

FIGS. 3A-3E show illustrative multi-stage processes for growing a buffer structure according to embodiments.

It is noted that the drawings may not be to scale. The drawings are intended to depict only typical aspects of the invention, and therefore should not be considered as limiting the scope of the invention. In the drawings, like numbering represents like elements between the drawings.

DETAILED DESCRIPTION OF THE INVENTION

Figure 1:
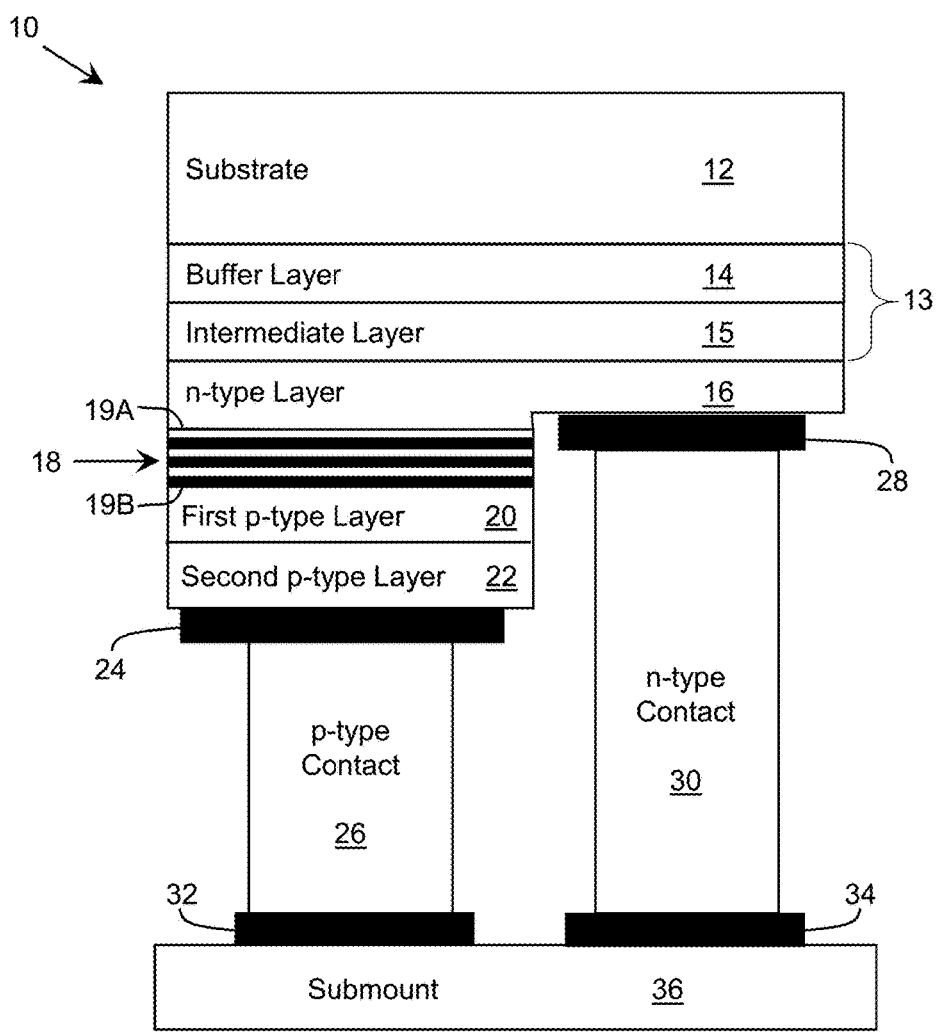
FIG. 1 shows a schematic structure of an illustrative optoelectronic device according to an embodiment.

As indicated above, aspects of the invention provide a semiconductor structure comprising a buffer structure and a set of semiconductor layers formed adjacent to a first side of the buffer structure. The buffer structure can have an effective lattice constant and a thickness such that an overall stress in the set of semiconductor layers at room temperature is compressive and is in a range between approximately 0.1 GPa and 2.0 GPa. The buffer structure can be grown using a set of growth parameters selected to achieve the target effective lattice constant a, control stresses present during growth of the buffer structure, and/or control stresses present after the semiconductor structure has cooled.

As described herein, the buffer structure can be configured to reduce internal stresses in the heterostructure, which can lead to improved reliability of the device. The buffer structure, as well as other layers of the heterostructure, can be grown using growth parameters configured to control the stresses present during growth. Furthermore, a reliability of the device depends on a number of dislocations present in the layers. In general, for thick layers, a dislocation density is substantially reduced due to layer relaxation through dislocation annihilation and bending. However, thick semiconductor layers can lead to increased stresses. As a result, design of a heterostructure typically requires a balance between stresses in the layers and a number of dislocations. However, for reliable devices, some number of dislocations may be preferred to be present as they may result in overall relaxation of the device.

As used herein, unless otherwise noted, the term "set" means one or more (i.e., at least one) and the phrase "any solution" means any now known or later developed solution. As used herein, unless otherwise noted, the term "set" means one or more (i.e., at least one) and the phrase "any solution" means any now known or later developed solution. As used herein, two materials have comparable compositions when the molar fractions of the corresponding materials differ by at most ten percent (five percent in a more specific embodiment). For example, considering two group III nitride materials, $Al_xIn_yB_zGa_{1-x-y-z}N$ and $Al_{x'}In_{y'}B_{z'}Ga_{1-x'-y'-z'}N$, the two materials have comparable compositions when each of the molar fractions x, y, and z differs from the corresponding molar fractions x', y', and z' by less than ten percent, where the percentage is calculated by taking a difference between the molar fractions and dividing the value by the higher molar fraction. Similarly, two layers have comparable thicknesses when the corresponding thicknesses differ by at most ten percent (five percent in a more specific embodiment). As also used herein, two dopant concentrations are comparable when they are on the same order as one another. It is understood that two numbers are on the same order as one another when a ratio of the higher number to the lower number is less than ten.

As used herein, a layer is a "transparent" layer when the layer allows at least ten percent of radiation having a target wavelength, which is radiated at a normal incidence to an interface of the layer, to pass there through. Furthermore, as used herein, a layer is a "reflective" layer when the layer reflects at least ten percent of radiation having a target wavelength, which is radiated at a normal incidence to an interface of the layer. In an embodiment, the target wavelength of the radiation corresponds to a wavelength of radiation emitted or sensed (e.g., peak wavelength+/−five nanometers) by a device including the layer during operation of the device. For a given layer, the wavelength can be measured in a material of consideration and can depend on a refractive index of the material.

Aspects of the invention provide a heterostructure that can be incorporated into (used to fabricate) an optoelectronic device, such as a conventional or super luminescent light emitting diode (LED), a light emitting laser, a laser diode, a light sensor, a photodetector, a photodiode, an avalanche diode, and/or the like. However, it is understood that optoelectronic devices are only illustrative. For example, aspects of the invention provide a heterostructure that can be incorporated into other types of electronic devices, such as a high electron mobility transistor, a field effect transistor, a p-n diode, a Schottky diode, or the like. To this extent, aspects of the invention can be applied to the fabrication of any type of deice in which controlling stress characteristics are important for crack and dislocation reduction. In particular, for light emitting diodes fabricated using group III nitride semiconductor layers, the control of stress and dislocations within and in proximity of the active layer can provide improved device operation, extended operating lifetime of the device, and/or the like.

Turning to the drawings, FIG. 1 shows a schematic structure of an illustrative optoelectronic device 10 according to an embodiment. In a more particular embodiment, the optoelectronic device 10 is configured to operate as an emitting device, such as a light emitting diode (LED). In this case, during operation of the optoelectronic device 10, application of a bias comparable to the band gap results in the emission of electromagnetic radiation from an active region 18 of the optoelectronic device 10. The electromagnetic radiation emitted by the optoelectronic device 10 can have a peak wavelength within any range of wavelengths, including visible light, ultraviolet radiation, deep ultraviolet radiation, infrared light, and/or the like. In an embodiment, the device 10 is configured to emit radiation having a dominant wavelength within the ultraviolet range of wavelengths. In a more specific embodiment, the dominant wavelength is within a range of wavelengths that includes deep ultraviolet radiation, e.g., between approximately 210 and approximately 350 nanometers.

The optoelectronic device 10 includes a heterostructure comprising a substrate 12 and a buffer structure 13 located adjacent thereto. The buffer structure 13 is shown including a buffer layer 14 adjacent to the substrate 12 and an intermediate layer 15 adjacent to the buffer layer 14. The optoelectronic device 10 further includes an n-type layer 16 (e.g., a cladding layer, electron supply layer, contact layer, and/or the like) adjacent to the buffer structure 13, and an active region 18 having an n-type side 19A adjacent to the n-type layer 16. Furthermore, the heterostructure of the optoelectronic device 10 includes a first p-type layer 20 (e.g., an electron blocking layer) adjacent to a p-type side 19B of the active region 18 and a second p-type layer 22 (e.g., a cladding layer, hole supply layer, contact layer, and/or the like) adjacent to the first p-type layer 20.

In a more particular illustrative embodiment, the optoelectronic device 10 is a group III-V materials based device, in which some or all of the various layers are formed of elements selected from the group III-V materials system. In a still more particular illustrative embodiment, the various layers of the optoelectronic device 10 are formed of group III nitride based materials. Group III nitride materials comprise one or more group III elements (e.g., boron (B), aluminum (Al), gallium (Ga), and indium (In)) and nitrogen (N), such that $Al_xGa_yB_zIn_{1-x-y-z}N$, where $0 \leq x,y,z \leq 1$ and $0 \leq 1-x-y-z \leq 1$. Illustrative group III nitride materials include binary, ternary and quaternary alloys such as, AlN, GaN, InN, BN, AlGaN, AlInN, AlBN, AlGaInN, AlGaBN, AlInBN, and AlGaInBN with any molar fraction of group III elements.

An illustrative embodiment of a group III nitride based optoelectronic device 10 includes an active region 18 (e.g., a series of alternating quantum wells and barriers) composed of $In_yAl_xGa_{1-x-y}N$, $Ga_zIn_yAl_xB_{1-x-y-z}N$, an $Al_xGa_{1-x}N$ semiconductor alloy, or the like. Similarly, both the n-type layer 16 and the first p-type layer 20 can be composed of an $In_yAl_xGa_{1-x-y}N$ alloy, a $Ga_zIn_yAl_xB_{1-x-y-z}N$ alloy, or the like. The molar fractions given by x, y, and z can vary between the various layers 16, 18, and 20. The substrate 12 can be sapphire, silicon carbide (SiC), silicon (Si), GaN, AlGaN, AlON, $LiGaO_2$, $LiGaO_2$, $ScMgAlO_4$, $MgAl_2O_4$, or another suitable material, and each of the buffer layer 14 and intermediate layer 15 can be composed of AlN, InN, GaN, SiN, or their alloys, an AlGaN/AlN superlattice, and/or the like.

As shown with respect to the optoelectronic device 10, a p-type metal 24 can be attached to the second p-type layer 22 and a p-type contact (electrode) 26 can be attached to the p-type metal 24. Similarly, an n-type metal 28 can be attached to the n-type layer 16 and an n-type contact (electrode) 30 can be attached to the n-type metal 28. The p-type metal 24 and the n-type metal 28 can form ohmic contacts to the corresponding layers 22, 16, respectively. In an embodiment, the p-type metal 24 and the n-type metal 28 each comprise several conductive and reflective metal layers, while the n-type contact 30 and the p-type contact 26 each comprise highly conductive metal. In an embodiment, the second p-type layer 22 and/or the p-type contact 26 can be transparent (e.g., semi-transparent or transparent) to the electromagnetic radiation generated by the active region 18. For example, the second p-type layer 22 and/or the p-type contact 26 can comprise a short period superlattice lattice structure, such as an at least partially transparent magnesium (Mg)-doped AlGaN/AlGaN short period superlattice structure (SPSL). In an illustrative embodiment, the second p-type layer 22 is a superlattice comprising $Al_xGa_{1-x}N/Al_yGa_{1-y}N$ layers, with $0.2 < x < 1$, and $0 < y < 0.8$, and with each layer of the superlattice having a thickness in the range of 0.1 to 20 nanometers. Furthermore, the p-type contact 26 and/or the n-type contact 30 can be reflective of the electromagnetic radiation generated by the active region 18. In another embodiment, the n-type layer 16 and/or the n-type contact 30 can be formed of a short period superlattice, such as an AlGaN SPSL, which is transparent to the electromagnetic radiation generated by the active region 18.

As further shown with respect to the optoelectronic device 10, the device 10 can be mounted to a submount 36 via the contacts 26, 30 in a flip chip configuration. In this case, the substrate 12 is located on the top of the optoelectronic device 10, which can provide improved heat management during operation of the device 10. To this extent, the p-type contact 26 and the n-type contact 30 can both be attached to a submount 36 via contact pads 32, 34, respectively. The submount 36 can be formed of aluminum nitride (AlN), silicon carbide (SiC), and/or the like.

Any of the various layers of the optoelectronic device 10 can comprise a substantially uniform composition or a graded composition. For example, a layer can comprise a graded composition at a heterointerface with another layer. In an embodiment, the first p-type layer 20 comprises a p-type electron blocking layer having a graded composition. The graded composition(s) can be included to, for example, reduce stress, improve carrier injection, and/or the like. Similarly, a layer can comprise a superlattice including a plurality of periods, which can be configured to reduce stress, and/or the like. In this case, the composition and/or width of each period can vary periodically or aperiodically from period to period.

It is understood that the layer configuration of the optoelectronic device 10 described herein is only illustrative. To this extent, a heterostructure for an optoelectronic device can include an alternative layer configuration in which one or more layers are not included and/or one or more additional layers are included. As a result, while the various layers are shown immediately adjacent to one another (e.g., contacting one another), it is understood that one or more intermediate layers can be present in a heterostructure for an optoelectronic device and/or one or more of the layers shown may not be present. For example, an illustrative heterostructure for an optoelectronic device can include an undoped layer between the active region 18 and one or both of the second p-type layer 22 and the n-type layer 16. Similarly, an illustrative heterostructure for an optoelectronic device can be implemented without the intermediate layer 15, with the substrate 12 removed, and/or the like.

Still further, an alternative device heterostructure can include three (or more) p-type layers located on the p-type side 19B of the active region 18. For example, the p-type layers can include: an electron blocking layer (e.g., the first p-type layer 20) located immediately adjacent to the active region 18; a p-type cladding layer (e.g., the second p-type layer 22) located immediately adjacent to the electron blocking layer; and a p-type doping layer located immediately adjacent to the p-type cladding layer (e.g., between the second p-type layer 22 and the p-type metal 24). In this case, each p-type layer can be epitaxially grown on a preceding layer. In a more particular embodiment, the p-type doping layer can be formed of $Al_xGa_{1-x}N$, where $0 \leq x \leq 0.5$, can have a thickness in a range of 1 nanometer to 500 nanometers, and can have a p-type doping concentration greater than or equal to $1 \times 10^{18}$ dopants per $cm^3$.

Furthermore, a heterostructure for an optoelectronic device can include a Distributive Bragg Reflector (DBR) structure, which can be configured to reflect light of particular wavelength(s), such as those emitted by the active region 18, thereby enhancing the output power of the device/heterostructure. For example, for the flip chip configuration illustrated, the DBR structure can be located between the second p-type layer 22 and the active region 18. Similarly, a heterostructure for an optoelectronic device can include a first p-type layer 20 located between the second p-type layer 22 and the active region 18. The DBR structure and/or the first p-type layer 20 can have any composition selected based on a desired wavelength of the light generated by the device. In one embodiment, the DBR structure has a Mg, Mn, Be, or Mg+Si-doped p-type composition. The first p-type layer 20 can have a p-type AlGaN, AlInGaN, and/or the like. It is understood that a heterostructure for an optoelectronic device can include both the DBR structure and the first p-type layer 20 (which can be located between the DBR structure and the second p-type layer 22) or can include only one of the DBR structure or the first p-type layer 20. In an embodiment, the first p-type layer 20 can be included in the device/heterostructure in place of an electron blocking layer. In another embodiment, the first p-type layer 20 can be included between the second p-type layer 22 and the electron blocking layer.

In an embodiment, each of the layers 14, 15, 16, 18, 20, 22 are epitaxially grown on the substrate 12. Illustrative growth parameters for group III nitride layers 14, 15, 16, 18, 20, 22 can include: a group III precursor flow rate between approximately 0.1 and approximately 200 micromoles per minute; a nitrogen precursor flow rate between approximately 100 and 10000 standard cubic centimeters per minute (SCCM); and a pressure between approximately 1 and 760 Torr.

In an embodiment, the buffer layer 14 is configured to relieve stress in the set of semiconductor layers located on a side of the buffer layer 14 opposite the location of the substrate 12, e.g., in the intermediate layer 15, the n-type layer 16, the active region 18, the p-type layers 20, 22, and/or the like. To this extent, the buffer layer 14 can have an effective lattice constant such that, when measured at room temperature, an overall stress in the buffer layer 14 is both compressive and small. As used herein, a compressive stress is small when the stress is less than or equal to approximately two GPa. In an embodiment, when measured at room temperature, the set of semiconductor layers has a compressive stress in a range between approximately 0.1 GPa and approximately 2.0 GPa. For example, the compressive stress can be estimated using the bowing of the substrate wafer over which the epitaxial film is grown. The bowing is characterized by the displacement of the middle of the wafer relative to the edge of the wafer. An illustrative growth process for a buffer layer 14 described herein can use growth temperatures in a range between approximately 500° C. and approximately 1500° C. and a growth rate between approximately 0.01 micrometers per hour and approximately 10 micrometers per hour.

In an embodiment, the buffer layer 14 is grown using a multi-stage process in order to obtain the small compressive stress in the buffer layer 14. In a first stage of the process, a plurality of nucleation islands are grown on the surface of the substrate 12. During the first stage, various attributes of the nucleation islands can be controlled by varying one or more growth conditions used during growth of the nucleation islands. Illustrative attributes include: an average size of the nucleation islands; a density of the nucleation islands (e.g., an average separation distance); an average ratio of vertical size to lateral size of the nucleation islands; and/or the like. Illustrative growth conditions that can be varied include: a growth temperature; a ratio of group V precursor(s) to group III precursor(s) (the V/III ratio); a growth duration; a growth pressure; and/or the like. Further discussion of illustrative growth conditions assumes a growth pressure in a range between approximately 1 Torr and approximately 760 Torr. However, it is understood that this is only illustrative. Additionally, a growth process described herein is described in conjunction with growth of an AlN buffer layer 14. However, it is understood that a similar growth process can be utilized to form a layer (which may or may not be a buffer layer 14) of another type of material and/or a combination of two or more materials.

Figure 2A:
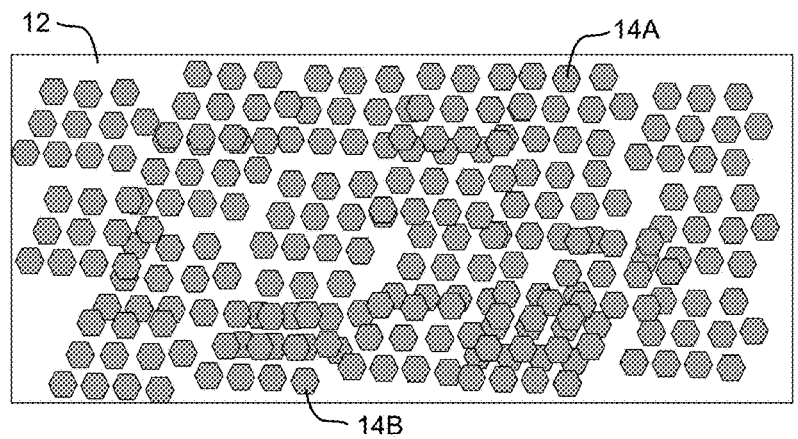
FIGS. 2A and 2B show top views of illustrative nucleation islands grown on a substrate according to embodiments.
Figure 2B:
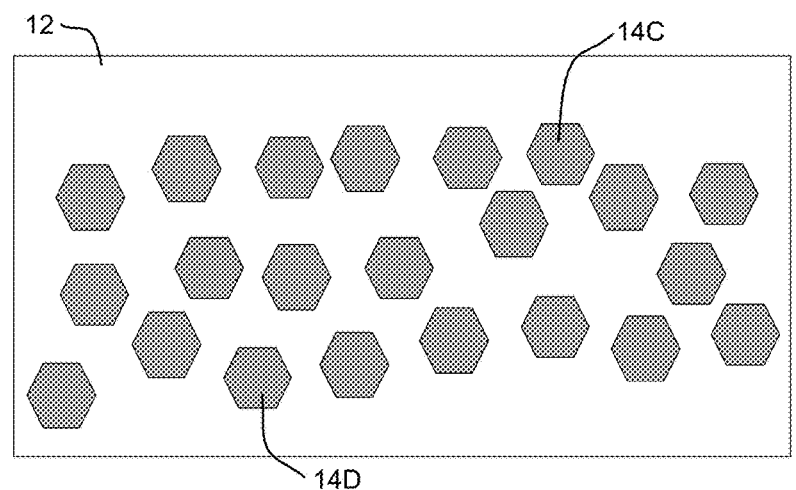

FIGS. 2A and 2B show top views of illustrative nucleation islands grown on a substrate according to embodiments. The nucleation islands 14A, 14B shown in FIG. 2A are relatively small and relatively densely packed as compared to the nucleation islands 14C, 14D shown in FIG. 2B. The nucleation islands 14A, 14B of FIG. 2A can result from a nucleation growth mode characterized by relatively low temperatures in a range of approximately 600° C. to approximately 1100° C. and an extended duration between approximately one minute and approximately twenty minutes. The nucleation islands 14C, 14D of FIG. 2B can result from an alternative nucleation growth mode characterized by temperatures in a range of approximately 1100° C. to approximately 1300° C. and a duration of approximately ten minutes or more.

In general, coalescence of small nucleation islands can result in increased tensile stresses. Under such a growth condition, only relatively thin layers of aluminum nitride can be produced without the generation of cracks. Growth of only a few nucleation islands can be lead to lower tensile stresses, or in some cases, to small compressive stresses during subsequent growth. However, while low tensile stresses can be beneficial during the growth of a semiconductor layer, subsequent large compressive stresses developed during cooling can severely affect a quality of the material, reducing overall reliability of the resulting devices.

Changes in the V/III ratio during the growth of nucleation islands can lead to variation in a lattice constant of the resulting buffer layer 14 (FIG. 1) and to generation of voids and/or nano-cavities within the layer. Such voids/nano-cavities can further affect the elastic properties of the resulting buffer layer 14, making it "softer" and more readily capable of absorbing stresses due to subsequently grown epitaxial layers. In addition, as the V/III ratio increases, a vertical growth rate is enhanced and a lateral growth rate is restrained.

In an embodiment, the inventors propose to select a target size and a target density of the nucleation islands, which facilitate more readily control over tensile stresses within the resulting buffer layer. During growth of the nucleation islands 14A-14D, the inventors propose to control a typical size of the nucleation islands 14A-14D by adjusting a V/III ratio used during the growth. Furthermore, the inventors propose to increase a density of the nucleation islands 14A-14D by increasing a duration of the nucleation island growth. The number of nucleation islands 14A-14D can be adjusted by adjusting one or more growth parameters including: a duration of the epitaxial growth; a flow set for various metalorganic precursors; a growth temperature; a growth pressure; a ratio of group V precursors to group III precursors; and/or the like. An illustrative growth process for growth of an AlN buffer layer 14 is described herein. However, it is understood that similar techniques but with different growth conditions (e.g., ranges for temperature and V/III ratio) can be applied to growth of any of various $Al_xIn_yGa_{1-x-y}N$ alloy layers.

Figure 3A:
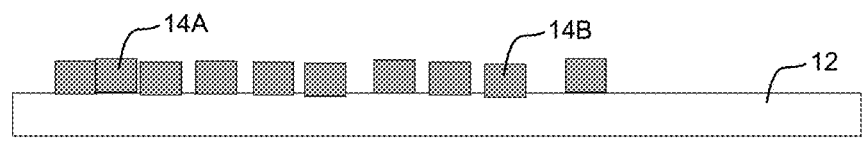
Figure 3B:
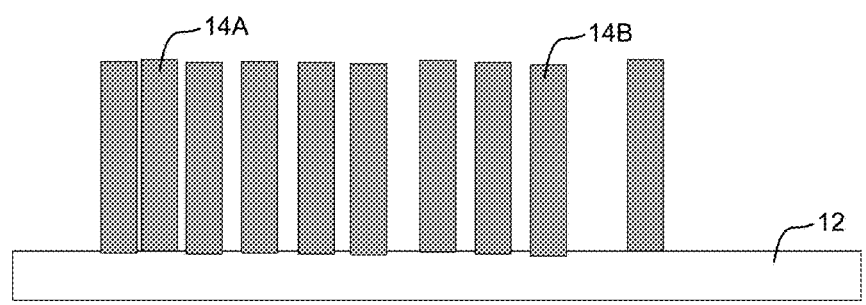
Figure 3C:
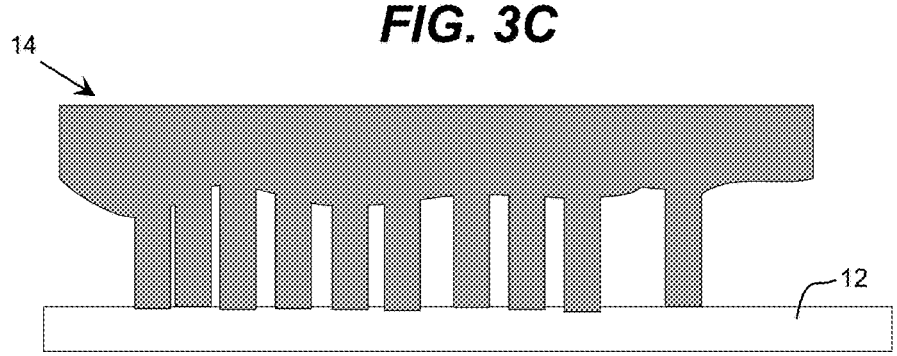

FIGS. 3A-3C show an illustrative multi-stage process for growing a buffer layer according to an embodiment. As described herein, in the first stage shown in FIG. 3A, a plurality of nucleation islands 14A-14B can be grown on a substrate 12. In an embodiment, the nucleation islands 14A-14B are formed of a similar material (e.g., AlN). Alternatively, the nucleation islands 14A-14B can be formed of multiple dissimilar materials, such as any combination of two or more of: InN, GaN, AlN, SiN, or their alloys. Introduction of nucleation islands 14A-14B formed of dissimilar materials can allow for additional control of stresses within the buffer structure, which can lead to overall improvement in stress management of subsequently grown semiconductor layers.

The growth conditions used during the first stage can induce three dimensional growth of the nucleation islands 14A-14B. In an embodiment, the resulting nucleation islands 14A-14B have a typical (e.g., average) size in a range between approximately 1 nanometer and approximately 100 nanometers and a typical (e.g., average) spacing, as measured from edge-to-edge between adjacent islands, in a range between approximately 10 nanometers and approximately 200 nanometers. In an embodiment, the growth conditions include: a relatively low temperature in a range of approximately 600° C. to approximately 1300° C. (1100° C. in a more particular embodiment); a relatively high V/III ratio in a range of approximately 100 to approximately 50000; and an extended duration in a range of approximately one minute to approximately twenty minutes.

In a second stage of the growth process, which is shown in FIG. 3B, growth conditions that induce vertical growth of the nucleation islands 14A-14B can be utilized. For example, a growth temperature can be increased, a high V/III ratio can be utilized, and a precursor flow rate can be changed (e.g., decreased) to a range of approximately 1 micromole/minute and approximately 100 micromoles/minute. In an embodiment, the growth conditions for the second stage include: a relatively high temperature in a range of approximately 1000° C. to approximately 1300° C.; a relatively high V/III ratio in a range of approximately 1000 to approximately 50000; and a duration of approximately 1 hour to approximately 10 hours. In an embodiment, the nucleation islands 14A-14B are grown to a height in a range of approximately 5 Angstroms to approximately 100 Angstroms.

In a third stage of the growth process, which is shown in FIG. 3C, growth conditions that result in coalescence of the nucleation islands 14A-14B into a single layer 14 can be utilized. For example, a growth temperature can be again increased and a low V/III ratio can be utilized. In an embodiment, the growth conditions for the third stage include: a relatively high temperature in a range of approximately 1100° C. to approximately 1600° C.; a relatively low V/III ratio in a range of approximately 1 to approximately 2500; and a duration sufficient to allow the coalesced islands 14A-14B to grow to a thickness in a range of approximately 100 Angstroms to approximately 100 microns. During the third stage, a small molar fraction (e.g., one to five percent) of gallium can be added within the semiconductor layer, which can further increase coalescence of the nucleation islands 14A-14B. The stresses present during the nucleation island coalescence can be tensile. In an embodiment, the growth conditions described herein are selected to result in small tensile stresses being present during growth of the buffer layer 14, and reasonably small compressive stresses at room temperature.

After completion of the third stage, the nucleation islands 14A-14B can be fully coalesced into a pit-free, single-crystalline semiconductor (e.g., AlN) layer. As illustrated, the resulting buffer layer 14 includes at least two distinct sublayers, a nucleation sublayer, which includes the nucleation islands 14A-14B and a high temperature growth sublayer, in which the nucleation islands 14A-14B have coalesced.

In an embodiment, the multi-stage growth process shown in FIGS. 3A-3C is repeated two or more times to produce various sub-layers of variable elastic and thermo-mechanical properties for stress management within the buffer layer 14. In this case, each repeated application of the multi-stage growth process can utilize the same growth conditions as a previous application or can utilize one or more differing growth conditions (e.g., a change in growth duration, a change in V/III ratio, and/or the like.

For example, FIG. 3D shows an illustrative heterostructure including a buffer structure 13A comprising an intermediate layer with multiple intermediate sub-layers 15A-15C according to an embodiment. In an embodiment, the intermediate sub-layers 15A-15C can be fabricated as shown and described in U.S. Pat. No. 9,330,906, which is hereby incorporated by reference. To this extent, the intermediate sub-layers 15A-15C can comprise a nucleation sub-layer 15A, a cavity containing sub-layer 15B, and a coalescing semiconductor sub-layer 15C. The cavity containing sub-layer 15B can act as a stress-relieving layer in the buffer structure 13A.

Each sub-layer 15A-15C can have a thickness that is larger than two monolayers. In an embodiment, a thickness of each sub-layer 15A-15C is within a range of approximately ten to approximately ten thousand nanometers. A thickness of the cavity containing sub-layer 15B can be selected based on a thickness by which nucleation islands 17A, 17B in the nucleation sub-layer 15A will coalesce, which is highly dependent on the original separation distance of the nucleation islands 17A, 17B in the nucleation sub-layer 15A. A thickness of the coalescing semiconductor sub-layer 15C can be selected to limit cracking. In a more specific illustrative embodiment: a thickness for the nucleation sub-layer 15A is between approximately 5 nanometers and approximately 100 nanometers; a thickness of the cavity containing sub-layer 15B is between approximately 1 micron and approximately 10 microns; and a thickness of the coalescing semiconductor sub-layer 15C is between approximately 1 micron and approximately 4 microns.

In an embodiment, each of the intermediate sub-layers 15A-15C are epitaxially grown on the buffer layer 14. Growth of the nucleation sub-layer 15A can include growth of a plurality of nucleation islands 17A, 17B at a growth temperature and V/III ratio configured to result in nucleation islands 17A, 17B having a relatively large lateral size of a few to a few hundred nanometers (e.g., few tens of nanometers), with a similar separation distance between the islands 17A, 17B. Growth of the cavity containing sub-layer 15B can use growth conditions configured to result in one or more cavities (voids) 21A, 21B being present in the cavity containing sub-layer 5B. Growth of the coalescing semiconductor sub-layer 15C can be performed using any growth conditions (e.g., temperature and V/III ratio) configured to result in a coalesced semiconductor sub-layer 15C.

Figure 3E:
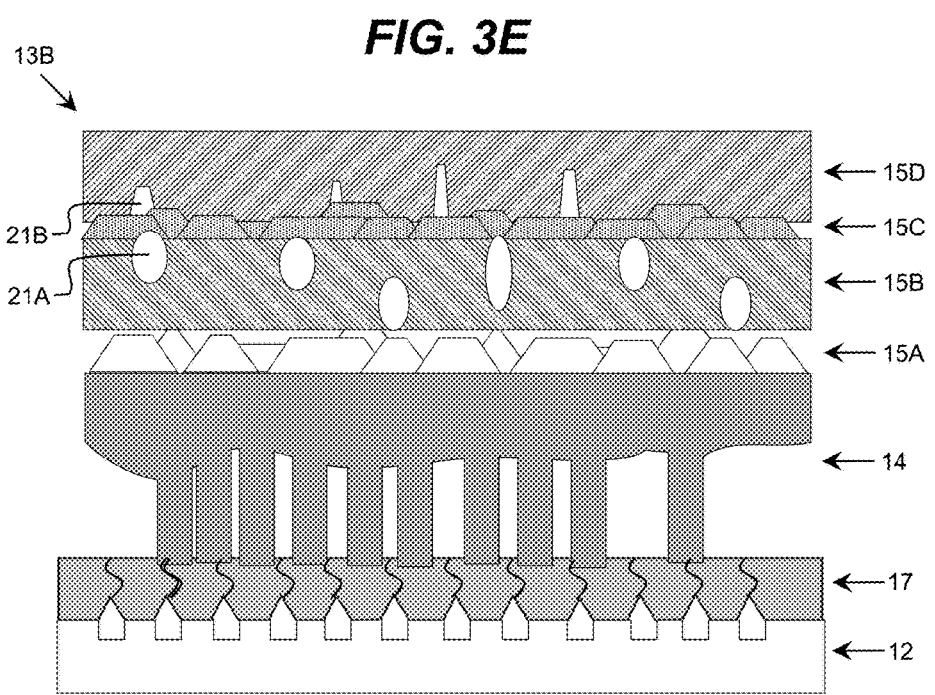

FIG. 3E shows another illustrative heterostructure including a buffer structure 13B comprising an intermediate layer with multiple intermediate sub-layers 15A-15D according to an embodiment. In an embodiment, the intermediate sub-layers 15A-15D can be fabricated as shown and described in U.S. Pat. No. 9,330,906, which is hereby incorporated by reference. To this extent, the intermediate sub-layers 15A-15C can comprise a first nucleation sub-layer 15A and a first cavity containing sub-layer 15B, and a second nucleation sub-layer 15C and a second cavity containing sub-layer 15D. To this extent, the buffer structure 13B includes an intermediate layer with multiple nucleation sub-layers 15A, 15C alternating with multiple cavity containing sub-layers 15B, 15D. While the buffer structure 13B is shown including two nucleation sub-layers 15A, 15C and two cavity containing sub-layers 15B, 15D, it is understood that an intermediate layer can include any number of nucleation and/or cavity containing sub-layers.

As illustrated, the cavities 21A, 21B present in the respective cavity containing sub-layers 15B, 15D can have different sizes, different densities, and/or the like, depending on the growth conditions used for the sub-layers 15B, 15D.

Furthermore, the cavities 21A, 21B present in the respective cavity containing sub-layers 15B, 15D may not have any particular alignment and can be misaligned. In an embodiment, an intermediate layer includes a cavity containing sub-layer, such as the cavity containing sub-layer 15D, with cavities 21B having one or more characteristic dimensions (e.g., lateral size, vertical size, density, separation, and/or the like) that differs by at least five percent from the corresponding characteristic dimension(s) of the cavities 21A present in the previous cavity containing sub-layer 15B.

Since the presence of cavities 21A, 21B affects the elastic properties of the corresponding semiconductor sub-layers 15B, 15D, a multilayered intermediate layer containing multiple semiconductor sub-layers 15B, 15D with variable cavity sizes and densities can allow for control of elastic properties of the semiconductor layers throughout the vertical dimension of the intermediate layer. In an embodiment, a concentration of the cavities 21A, 21B in the lateral and/or normal directions to the buffer structure 13B can be varied gradually and/or abruptly. Such variation can be utilized, for example, to optimize control of stresses and/or an index of refraction of the overall heterostructure, e.g., for light propagation (e.g., extraction) purposes.

An embodiment of a buffer layer 14 described herein can be grown on a substrate 12 having a patterned surface. For example, as illustrated in FIG. 3E, the substrate 12 can have a patterned surface including openings that extend through a portion of the thickness of the substrate 12. The patterning can be configured to improve the epitaxial growth of the buffer layer 14 thereon. In an embodiment, the patterning includes a plurality of openings (valleys) having a characteristic (e.g., average) diameter of between approximately 0.1 micron to approximately 5 microns and a characteristic depth of at least 0.2 microns. In an embodiment, a characteristic size of the openings is comparable to a characteristic size of the protruding regions (pillars) of the substrate 12 surface.

Furthermore, a nucleation layer 17 (e.g., aluminum nitride) can be grown directly on the patterned surface of the substrate 12 using any solution. As illustrated, the nucleation layer 17 can be grown on the protruding regions defined by the openings in the substrate surface in a manner that causes the semiconductor material of the nucleation layer 17 to coalesce, leaving openings with no semiconductor material on the interior of the structure defined by the substrate 12 and the nucleation layer 17. The nucleation layer 17 can provide a surface on which the buffer layer 14 is grown.

Figure 4:
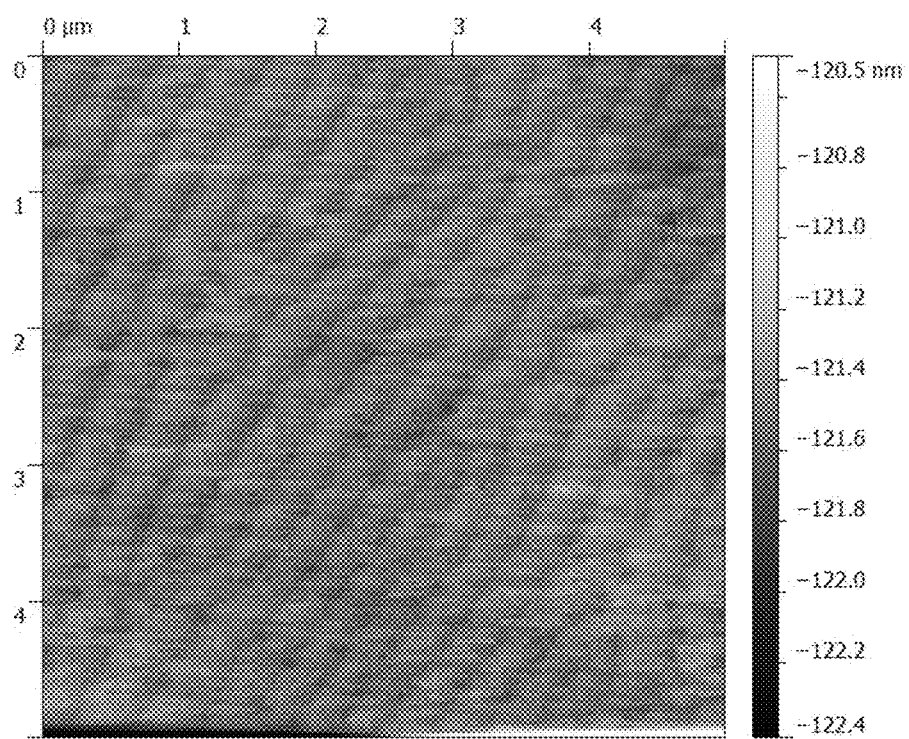
FIG. 4 shows an atomic force microscope image of a top surface of an illustrative buffer layer grown using a three-stage growth process described herein according to an embodiment.

FIG. 4 shows an atomic force microscope (AFM) image of a top surface of an illustrative buffer layer grown using a three-stage growth process described herein according to an embodiment. As illustrated, the buffer layer has an extremely flat surface morphology. In particular, an atomic step shows an RMS of approximately 1.0 Angstroms with a 5 µm×5 µm scan. Furthermore, an embodiment of a buffer layer grown using a solution described herein can have approximately $1\times10^9$ dislocation cores per $cm^2$ or less.

Figure 5:
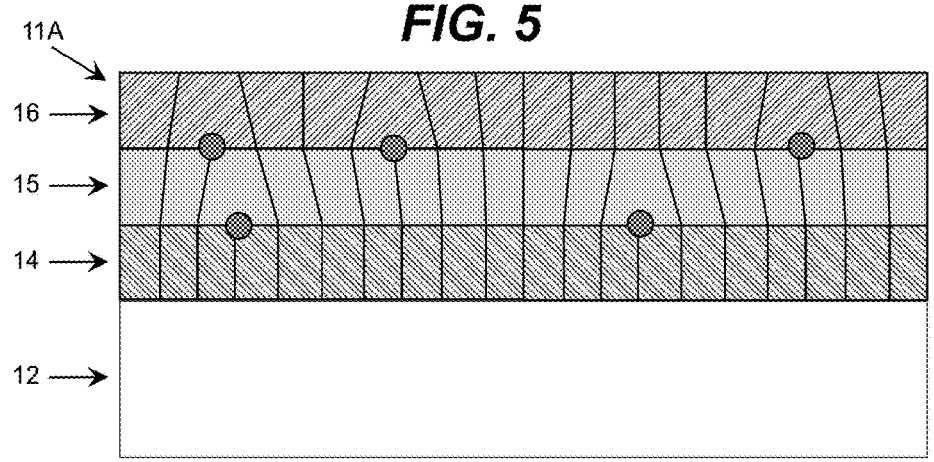
FIG. 5 shows an illustrative heterostructure including an intermediate layer and an n-type layer according to an embodiment
Figure 6:
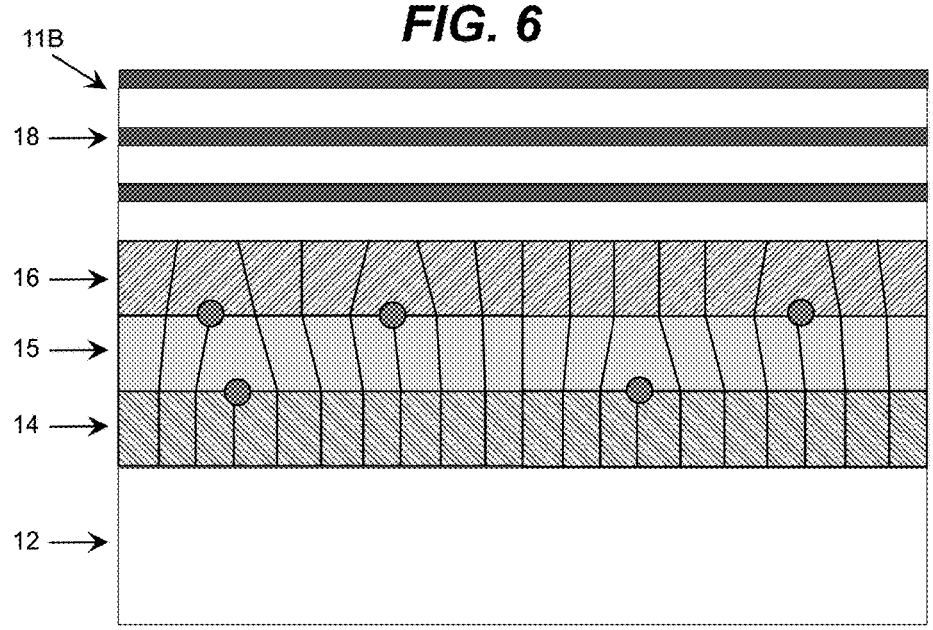
FIG. 6 shows an illustrative heterostructure including an active region according to an embodiment.

Additional layers of a heterostructure can be formed (e.g., grown) on the buffer layer 14. To this extent, FIG. 5 shows an illustrative heterostructure 11A including an intermediate layer 15 and an n-type layer 16 according to an embodiment. As illustrated, the heterostructure 11A includes a substrate 12 with a buffer layer 14 formed thereon. The intermediate layer 15 can be located between the buffer layer 14 and an n-type layer 16 (e.g., an n-type contact layer). As illustrated in FIG. 6, fabrication of a heterostructure 11B can include growth of the n-type layer 16 followed by epitaxial growth of an active region 18, which can include a plurality of quantum wells (dark sub-layers) alternating with a plurality of barriers (light sub-layers).

The intermediate layer 15 can be configured to: further mitigate propagation of dislocations from the buffer layer 14 to the n-type layer 16 and active region 18; relax layers, such as the n-type contact layer 16 and active region 18, which are subsequently epitaxially grown; and/or the like. For example, as illustrated by the vertically extending lines shown in heterostructures 11A, 11B, the intermediate layer 15 can include a large number of dislocations, which can result in relaxation in the subsequently grown layers, such as the n-type layer 16. As further illustrated, some of the dislocations present in the buffer layer 14 will terminate and not extend into the intermediate layer 15, and similarly, some of the dislocations present in the intermediate layer 15 will terminate and not extend into the n-type layer 16. The circles shown in FIGS. 5 and 6 indicate regions where a dislocation is located. In the drawings, the dislocations are lying into the plane, with each circle corresponding to a core of such dislocations. These are edge dislocations and they are propagated in a lateral direction on the plane. In an embodiment, a thickness of the buffer layer 14 and a thickness of the intermediate layer 15 are selected to result in a target amount of relaxation in the subsequent semiconductor layers. In an embodiment, the n-type layer 16 is a partially relaxed layer. For example, a thickness of each of the buffer layer 14 and the intermediate layer 15 can be on the order of one micron (e.g., 0.1 microns to 10 microns). In an illustrative embodiment, a threading dislocation density within the active region 18 is in a range of approximately $1 \times 10^3$ to approximately $5 \times 10^9$ threading dislocations per $cm^2$.

Figure 7:
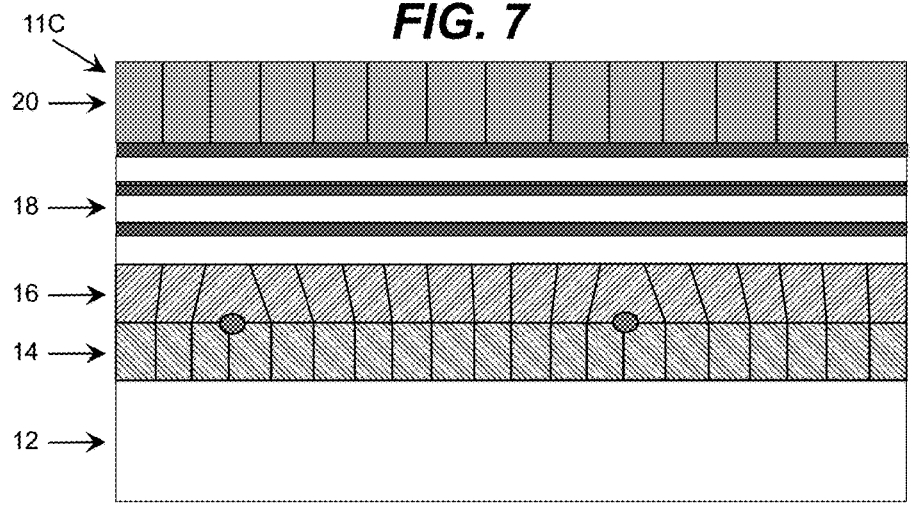
FIG. 7 shows an illustrative heterostructure including a first p-type layer according to an embodiment.

Formation of the layers of a heterostructure can further continue on the p-type side of the active region 18. For example, FIG. 7 shows an illustrative heterostructure 11C including a first p-type layer 20 (e.g., an electron blocking layer), which can be grown on the active structure 18, according to an embodiment. As illustrated in FIG. 7, the heterostructure 11C can be formed without including an intermediate layer 15. In this case, the n-type layer 16 can be epitaxially grown directly on the buffer layer 14. In an embodiment, the n-type layer 16 is under compression due to a reduced molar fraction of aluminum in the n-type layer 16 as compared to a molar fraction of aluminum in the layer on which the n-type layer 16 is grown, e.g., the buffer layer 14 or the intermediate layer 15.

Figure 8:
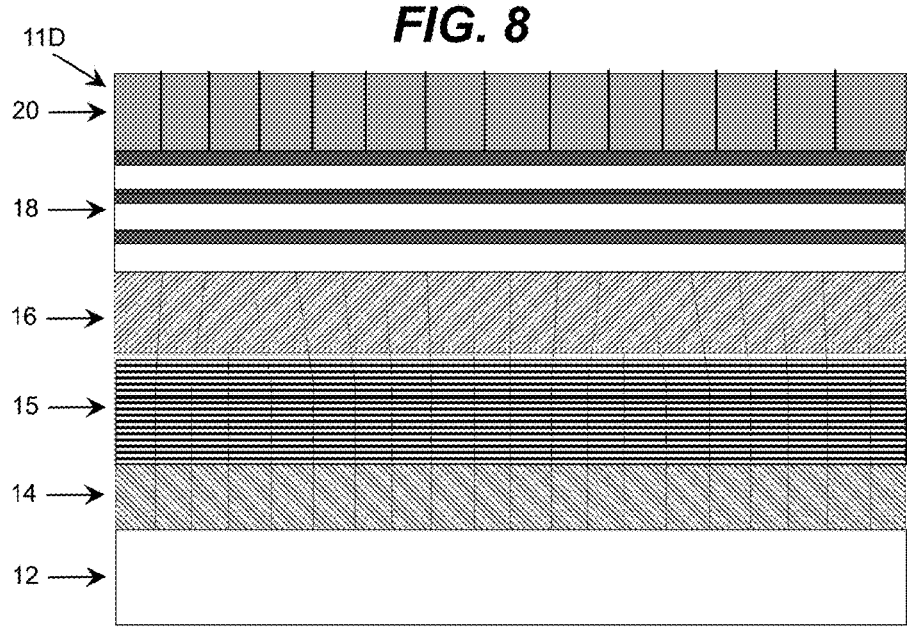
FIG. 8 shows an illustrative heterostructure including a superlattice as an intermediate layer according to an embodiment.

In an embodiment, a heterostructure can include an intermediate layer 15 configured to mitigate compression in the n-type contact layer 16, which can reduce a dislocation density in the n-type contact layer 16. For example, FIG. 8 shows an illustrative heterostructure 11D including a superlattice as an intermediate layer 15 according to an embodiment. In an embodiment, the intermediate layer 15 is a superlattice comprising AlN layers interchanged with $Al_xGa_{1-x}N$ layers. Each layer of such a superlattice can have a thickness in a range of approximately 10 nanometers (e.g., 5 to 15 nanometers) and the $Al_xGa_{1-x}N$ layers can contain a molar faction of aluminum, x, as low as approximately 0.7 (e.g., in a range of approximately 0.6 to approximately 0.9). The aluminum molar fraction for the various $Al_xGa_{1-x}N$ layers can remain constant throughout the superlattice or vary over a height of the superlattice using any solution (e.g., gradually decrease from the buffer layer 14 side to the n-type layer 16 side). Furthermore, the superlattice can include tens of periods (e.g., approximately 10 to approximately 100), with each period including an $AlN/Al_xGa_{1-x}N$ pair of layers. In general, a presence of such a superlattice provides a reduction dislocation density and mitigates stresses at the sharp interfaces between semiconductor layers with large (e.g., greater than ten percent) changes in aluminum molar fraction.

In an embodiment, the superlattice of the intermediate layer 15 can be grown using a set of growth conditions configured to manipulate stresses within the heterostructure 11D in a target manner. For example, during growth of the superlattice, a V/III ratio can be varied to further alter the resulting tensile and compressive stresses in each layer of the superlattice that results from the varying aluminum molar fraction of immediately adjacent layers.

Figure 9:
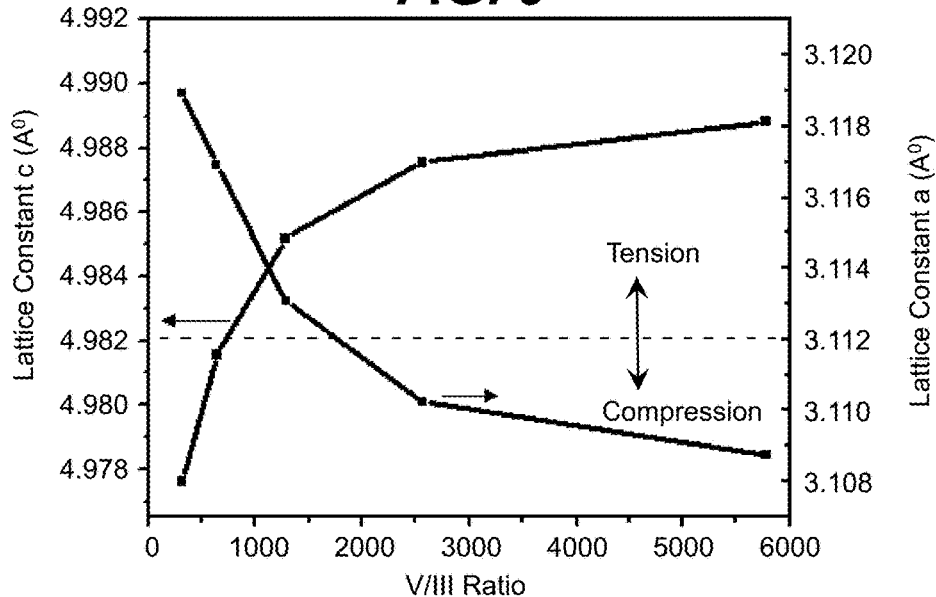
FIG. 9 shows illustrative plots of the lattice constants a and c as a function of the V/III ratio for an AlN layer according to an embodiment.

To this extent, FIG. 9 shows illustrative plots of the lattice constants a and c as a function of the V/III ratio for an AlN layer according to an embodiment. Different lattice directions can result in different tensile and compressive properties for the AlN layer. For example, for a low V/III ratio (e.g., less than approximately 1800), the lattice constant a for the AlN layer is slightly larger than the lattice constant a for an AlN layer without the presence of point defects (e.g., approximately 3.112). The difference in the lattice constant a results in tensile stresses being accumulated in the layer. For a high V/III ratio (e.g., greater than approximately 1800), the lattice constant a for the AlN layer is slightly smaller than the lattice constant a for an AlN layer without the presence of point defects, which results in compressive stresses being accumulated in the layer. The V/III ratio also influences the lattice constant c. In this case, small values of the V/III ratio (e.g., below approximately 750) result in a lattice constant c, which causes compressive stress (e.g., is below approximately 4.982) in the layer, while larger values of the V/III ratio (e.g., above approximately 750) result in a lattice constant c, which causes tensile stress in the layer.

Figure 10:
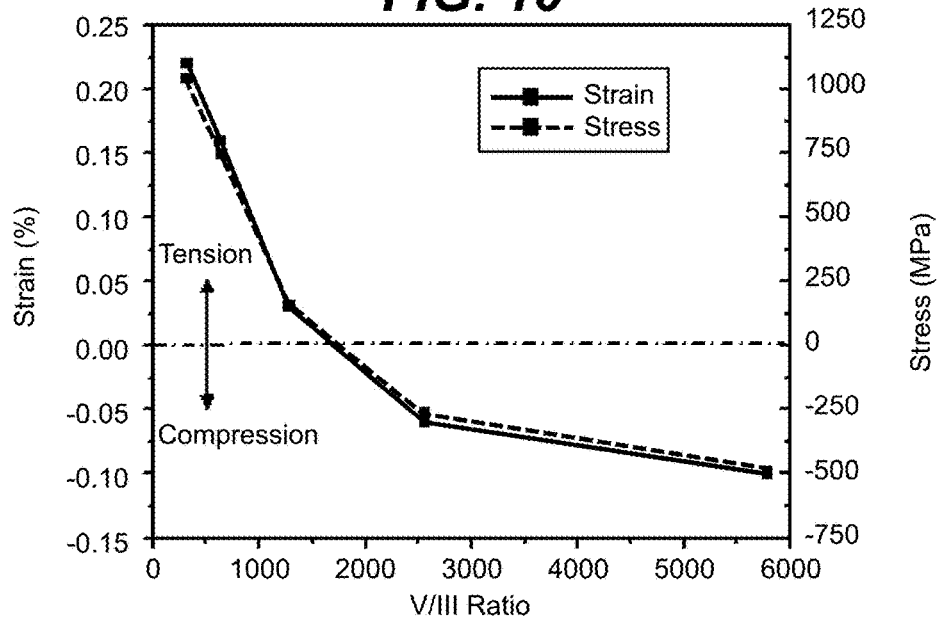
FIG. 10 shows illustrative plots of stress and strain as a function of the V/III ratio for an AlN layer according to an embodiment.

FIG. 10 shows illustrative plots of stress and strain as a function of the V/III ratio for an AlN layer according to an embodiment. As illustrated, an AlN layer grown under a low V/III ratio (e.g., less than approximately 1800) is in tensile stress, while an AlN layer grown with a high V/III ratio (e.g., above approximately 1800) is in compressive stress. As further illustrated, only small changes in the strain of the AlN layer are produced by modulating the V/III ratio. In an embodiment, growth of the buffer layer 14 uses a set of growth parameters, which are adjusted to decrease local tensile stresses during growth. Furthermore, the set of growth parameters can be configured to limit compressive stress during growth. In an embodiment, the compressive stress is limited to approximately 1.0 GPa or less during the growth.

In an embodiment, growth of the intermediate layer 15 includes growth of a series of sub-layers (e.g., films) with alternating tensile and compressive stresses. A layer can be selectively configured to have tensile or compressive stress by modulating a V/III ratio in each sub-layer. For example, the modulation can include varying the V/III ratio according to a set schedule to yield compressive and tensile sub-layers. Additionally, one or more additional deposition conditions can be changed, such as a growth temperature, a gas flow, and/or the like. Furthermore, one or more attributes of the sub-layers, such as a relative thickness of a sub-layer, a distribution of stress within each sub-layer, and/or the like, can be adjusted during the growth of the layer. The modulation of the set of deposition conditions can result in regions of increased compressive stresses and regions of increased tensile stress. In this manner, the resulting intermediate layer 15 can be configured to have a target overall residual stress (e.g., approximately zero or near zero).

Figure 11A:
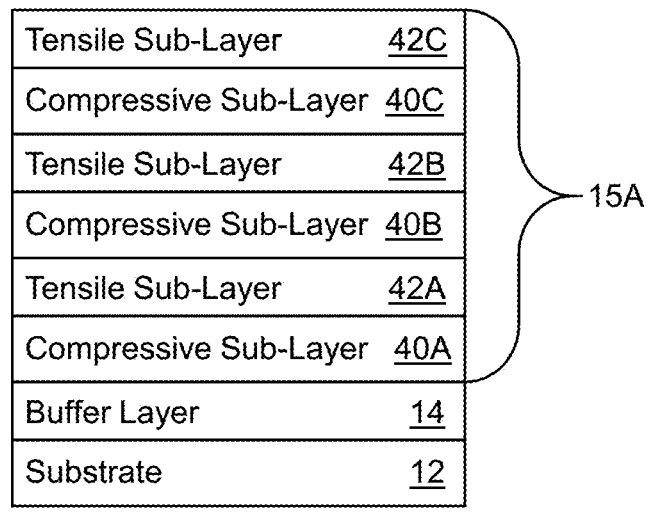
FIGS. 11A-11B show illustrative intermediate layers according to embodiments.
Figure 11B:
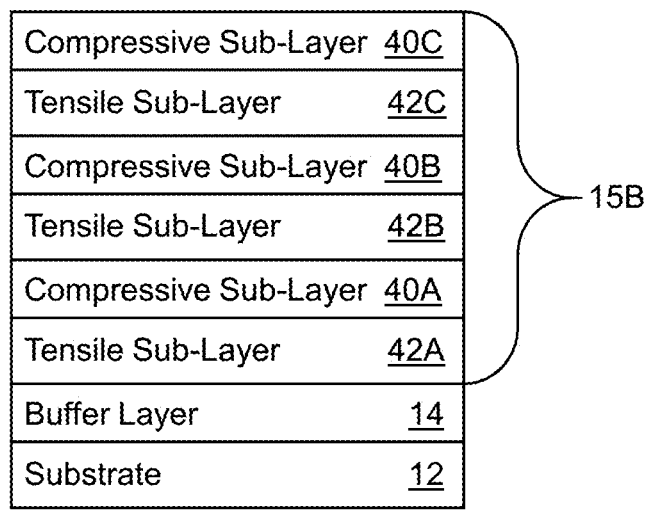

FIGS. 11A-11B show illustrative intermediate layers 15A-15B according to embodiments. Each intermediate layer 15A-15B is shown grown on a buffer layer 14, which can be grown on a substrate 12. In an embodiment, the substrate 12 is a foreign substrate, such as sapphire, SiC, or the like. The buffer layer 14 (e.g., a nucleation layer) can provide a transition to accommodate a large lattice mismatch between the substrate 12 and the corresponding intermediate layer 15A-15B. In an embodiment, the buffer layer 14 can comprise an $Al_xGa_{1-x}N/Al_yGa_{1-y}N$ superlattice, where $0 \le x$, $y \le 1$. Each superlattice layer can be, for example, up to several nanometers thick. In an embodiment, the layers with differing aluminum content (e.g., denoted by x and y) can have similar thicknesses. In an illustrative embodiment, the buffer layer 14 has a thickness in a range from nearly zero nanometers to approximately 2000 nanometers. In another embodiment, growth of the buffer layer 14 uses a growth temperature between approximately 500 and approximately 1200 degrees Celsius and a growth rate between approximately 0.01 micrometers and approximately 10 micrometers per hour.

Regardless, each intermediate layer 15A-15B is formed of a plurality of compressive sub-layers 40A-40C alternating with a plurality of tensile sub-layers 42A-42C. In the intermediate layer 15A, a compressive sub-layer 40A is first grown, while in the intermediate layer 15B, a tensile sub-layer 42A is first grown. While each intermediate layer 15A-15B is shown including three periods of epitaxial growth (e.g., each period including a compressive and a tensile layer), it is understood that an intermediate layer 15A-15B can include any number of periods. In an embodiment, the stress changes abruptly between a compressive layer and the adjacent tensile layer. Alternatively, the stress can gradually change between adjacent layers (e.g., by growing layers having a graded tensile or compressive stress). Furthermore, the tensile and compressive stress can be substantially constant between periods of the intermediate layer 15A-15B or can gradually change from period to period.

The growth of an intermediate layer 15A-15B, and the growth of the corresponding sub-layers 40A-40C, 42A-42C forming the intermediate layer 15A-15B, can use any set of deposition conditions. For example, the set of deposition conditions for a sub-layer 40A-40C, 42A-42C can include: a group III precursor flow rate between approximately 0.1 and approximately 200 micromoles per minute; a nitrogen precursor flow rate between approximately 100 and 10000 standard cubic centimeters per minute (SCCM); a pressure between approximately 1 and 760 Torr; a molar ratio of group V precursors to group III precursors (V/III ratio) between approximately 10 and approximately 10000; and a growth temperature between approximately 500 and approximately 1800 degrees Celsius. Furthermore, a sub-layer 40A-40C, 42A-42C can be grown to a thickness that is greater than a critical thickness to avoid pseudomorphic growth. In an embodiment, each sub-layer 40A-40C, 42A-42C has a thickness between approximately one nanometer and five micrometers.

As described herein, during the growth of an intermediate layer 15A-15B, one or more of a set of the deposition conditions for epitaxially growing a sub-layer 40A-40C, 42A-42C can be changed to cause the resulting sub-layer 40A-40C, 42A-42C to exhibit either tensile or compressive residual stress. For example, the growth of a compressive sub-layer and the growth of a tensile sub-layer can use molar ratios of group V precursors to group III precursors that differ by at least ten percent. In an embodiment, a composition of the compressive sub-layer differs from a composition of the tensile sub-layer by no more than approximately five percent. For example, a fraction of aluminum in the tensile sub-layer can differ from a fraction of aluminum in the compressive sub-layer by no more than approximately five percent. Similarly, the compressive and tensile sub-layers can have a lattice mismatch of at least 0.0001 Angstroms. Furthermore, a growth rate for the compressive and tensile sub-layers can be changed. In an embodiment, the growth rates for the compressive and tensile sub-layers differ by at least ten percent. A growth temperature for the compressive and tensile sub-layers can be substantially the same or changed. In an embodiment, the growth temperatures for the compressive and tensile sub-layers differ by at least two percent. Still further, the number of and/or type of precursors and/or agents present during the growth of a sub-layer can be adjusted to alter elastic properties of the sub-layer. For example, precursors and agents such as: ZnO, TiN, SiN, GaAs, AlAs, GaN, InN and/or the like, can induce inhomogeneities within the sub-layer, and thus alter the elastic properties of the sub-layer.

In an embodiment, the intermediate layers 15A, 15B shown in FIGS. 11A and 11B comprise only a sub-layer of an intermediate layer including multiple sublayers. For example, an embodiment of the coalescing semiconductor sub-layer 15C shown in FIG. 3D can be fabricated as described herein in conjunction with the intermediate layers 15A, 15B shown in FIGS. 11A and 11B. To this extent, a more particular embodiment of the coalescing sub-layer 15C shown in FIG. 3D can comprise AlGaN films having alternating tensile and compressive stresses, wherein the stresses are adjusted by varying a V/III ratio used during the growth of the plurality of films. In another embodiment, the coalescing sub-layer 15C shown in FIG. 3D can comprise a short period superlattice of $Al_xGa_{1-x}N/Al_yGa_{1-y}N$ films, with $0.5<x<0.9$ and $0.6<y\le1$; and film thicknesses being between 0.5 and 10 nm.

Figure 12:
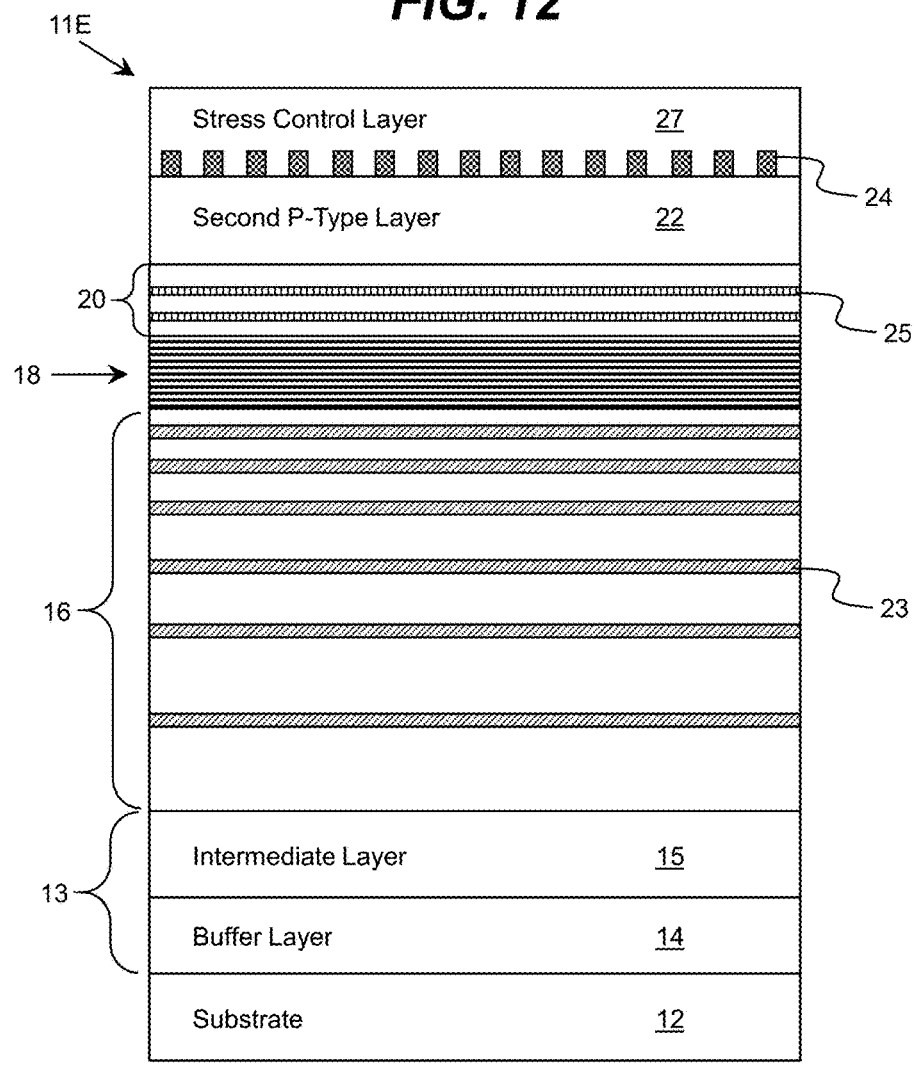
FIG. 12 shows an illustrative heterostructure including interlayers according to an embodiment.

Embodiments of one or more semiconductor layers described herein can include one or more features to provide internal stress management for the semiconductor layer. To this extent, FIG. 12 shows an illustrative heterostructure 11E including interlayers 23, 25 in two of the semiconductor layers according to an embodiment. As illustrated, the heterostructure 11E includes a substrate 12, a buffer layer 14, and an intermediate layer 15, each of which can be formed as described herein. For example, the intermediate layer 15 can include multiple pairs of tensile-compressive sub-layers. Regardless, a n-type layer 16 can be formed on the intermediate layer 15, followed by an active region 18, a first p-type layer 20, and a second p-type layer 22. While the n-type layer 16 is shown having a thickness significantly greater than the buffer structure 13, it is understood that an embodiment of the n-type layer 16 can have a thickness less than the buffer structure 13 (e.g., as shown in FIG. 8). In an embodiment, the n-type layer 16 can have a thickness between 0.5 to 1.5 microns. Selection of the thickness of n-type layer can be guided by tensile and compressive stress relaxation present within the layer.

Growth of the n-type layer 16 and/or the first p-type layer 20 (e.g., an electron blocking layer) can include formation of one or more interlayers 23, 25 therein. Each interlayer 23, 25 can comprise a thin (e.g., a thickness in a range of one atomic layer to 5 nanometers) semiconductor layer having a semiconductor composition that is significantly different from the semiconductor composition of the corresponding semiconductor layer 16, 20, respectively. As used herein, two compositions are significantly different when a molar fraction (x) of at least one element in a first composition differs from a molar fraction (y) of the same at least one element in the second composition by at least ten percent (i.e., x<0.9*y or x>1.1*y). In an embodiment, the interlayers 25 have a molar fraction of aluminum nitride that is at least ten percent lower than the molar fraction of aluminum nitride in the semiconductor layer 20. In general, the interlayers 23, 25 can be incorporated into semiconductor layers that require stress management. For instance, the n-type layer 16 (e.g., a cladding layer) might include high tensile stresses during epitaxial growth of the layer 16. In this case, incorporation of one or more interlayers 23 of aluminum nitride composition or having a high aluminum nitride molar fraction (e.g., at least 10% higher than the aluminum nitride molar fraction of the layer 16) can result in an overall stress management (e.g., reduction) of the tensile stresses in the n-type layer 16. Similarly, the first p-type layer 20 can comprise an electron blocking layer, which is typically under high tensile stress. As a result, one or more gallium nitride interlayers 25 can be formed therein.

In general the interlayers 23, 25 can be incorporated at a frequency and location within the corresponding semiconductor layer 16, 20 where the stress control is needed. For example, for the n-type layer 16, the interlayers 23 can be incorporated with a higher frequency in proximity to a boundary between n-type layer 16 and the active region 18. In an embodiment, the interlayers 23 can be incorporated in only a half of the n-type layer 16 that is closest to the active region 18. Regardless, it is understood that the frequency of the interlayers 23, 25 can be selected to reduce tensile stresses present in the corresponding semiconductor layer 16, 20. In an embodiment, inclusion of the interlayers 23 within the n-type layer 16 and/or a doping of the n-type layer 16 results in an average stress within the n-type layer being compressive and in a range between approximately 0.1 GPa and 2.0 GPa. While the heterostructure 11E is shown including a particular number of interlayers in specific layers, it is understood that this is only illustrative and embodiments of heterostructures described herein can include any number of layers in any location within the heterostructure 11E including any number of interlayers.

As previously described, a p-type metal can be deposited on the second p-type layer 22. In an embodiment illustrated in FIG. 12, the p-type metal 24 can comprise multiple openings, such as are present in a mesh structure. In this case, the p-type metal 24 can include multiple openings, which extend through the p-type metal 24 to a surface of the second p-type layer 22. In a further embodiment, a stress control layer 27 can be deposited over the p-type metal 24. The stress control layer 27 can induce stress within the second p-type layer 22, which can result in an overall improvement in reliability of a device fabricated using the heterostructure 11E.

Figure 13:
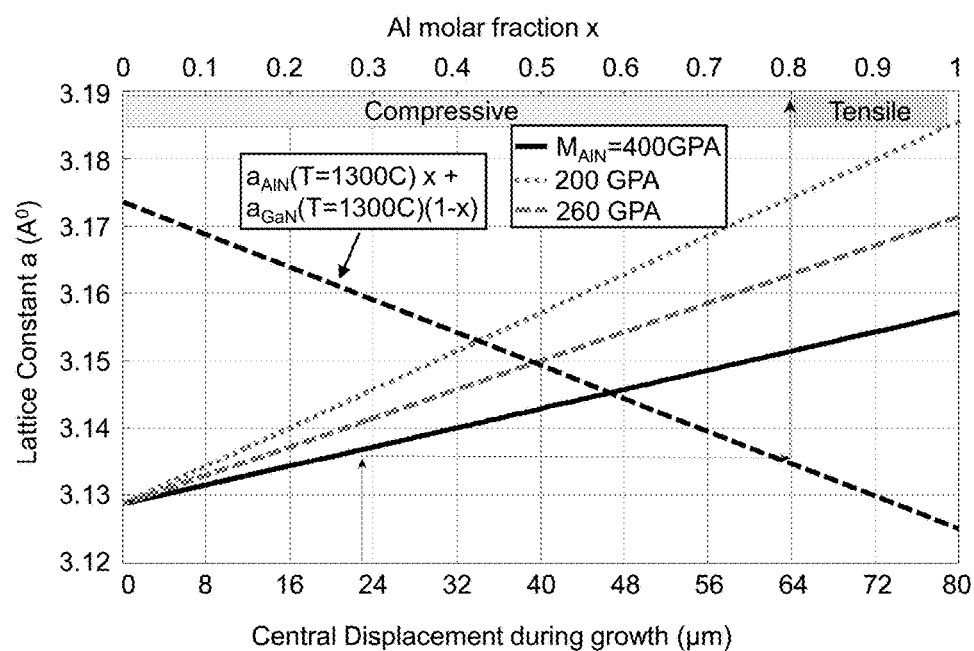
FIG. 13 shows various plots of the lattice constant a as a function of central displacement (bowing) during growth of an AlN layer and as a function of aluminum molar fraction in an AlGaN layer according to embodiments.

In an embodiment, a composition of the intermediate layer 15 is selected based on an effect of bowing of the substrate 12 on the stresses of the buffer layer 14. For example, FIG. 13 shows various plots of the lattice constant a as a function of central displacement (bowing) during growth of an AlN layer (e.g., the buffer layer 14) and as a function of aluminum molar fraction in an $Al_xGa_{1-x}N$ layer according to embodiments. The plots can be used, for example, to select a composition of the intermediate layer 15 (e.g., a superlattice forming the intermediate layer 15) that is configured to mitigate stress in an AlN buffer layer 14 (e.g., having a thickness of approximately 0.5 microns).

As illustrated in FIG. 13, during growth of the buffer layer 14 after the nucleation phase, the buffer layer 14 can experience high tensile stresses due to bowing, which can result in an increase of the effective lattice constant a for the buffer layer 14. The tensile stresses correlate with an amount of bowing that occurs during the growth of the buffer layer 14, and can be estimated using a known amount of bowing corresponding to a growth temperature and the substrate 12. Furthermore, the change in the effective lattice constant a is affected by an estimated biaxial modulus of the buffer layer 14. FIG. 13 includes three plots corresponding to three different estimated biaxial moduli ($M_{AlN}$) for an AlN buffer layer 14. In an embodiment, the bowing is measured as a displacement of a center of the substrate 12 (e.g., a sapphire wafer) used for epitaxial growth of the buffer layer 14. For a sapphire wafer, such a measurement can typically range between 10-400 microns.

In an embodiment, a composition of an $Al_xGa_{1-x}N$ sublayer of an $AlN/Al_xGa_{1-x}N$ superlattice forming the intermediate layer 15 is selected based on an estimated biaxial modulus of the buffer layer 14 and an amount of bowing (central displacement) that occurs during growth of the buffer layer 14. For example, using an estimated biaxial modulus of 400 GPa and a central displacement of 24 microns, an effective lattice constant a for an AlN buffer layer 14 can exceed 3.135 A at a growth temperature of 1300° C. It is understood that the actual lattice constant a of the AlN buffer layer 14 is subject to nucleation growth conditions and the tensile stresses acquired during such growth. The resulting lattice constant a of 3.135 A is larger than 3.125 A due to thermal expansion alone. The increased lattice constant a for the buffer layer 14 is most closely matched at the growth temperature of 1300° C. by an $Al_xGa_{1-x}N$ layer having an aluminum molar fraction of approximately 0.8. To this extent, the intermediate layer 15 can include an $Al_{0.8}Ga_{0.2}N$ layer, which can result in low stresses within the layer at the growth temperature. In an embodiment, the identified aluminum molar fraction is used as the aluminum molar fraction in a first $Al_xGa_{1-x}N$ sublayer of an $AlN/Al_xGa_{1-x}N$ superlattice forming the intermediate layer 15. In an alternative embodiment, the identified aluminum molar fraction is used as an average aluminum molar fraction present in all sub-layers in the superlattice.

An embodiment of the invention provides a process for growing a multi-layer semiconductor structure in which a content of a subsequent layer is at least partially selected based on stress and strain of the existing heterostructure. In this case, a curvature of the existing heterostructure can be measured in-situ during and/or after growth of a first layer (e.g., the buffer layer 14) having a target lattice constant $a_1$. The measured curvature can be used to determine a stress and strain in the first layer, e.g., using the modified Stoney's formula. The stress and strain can be used to select/adjust one or more aspects of the composition of the next layer to be grown and/or one or more growth parameters. For example, for a group III nitride semiconductor layer, the molar fraction of one or more of the group III elements present in the semiconductor layer can be adjusted. In an embodiment, the group III nitride composition is selected to have a target lattice constant $a_2$ when fully relaxed, such that $\epsilon_1 < (a_2-a_1)/a_1 < \epsilon_0$ with $\epsilon_0$ being no more than 0.5 percent and $\epsilon_1$ being no less than −0.05 percent. Subsequently, the second layer is grown to have the selected composition. Similarly, one or more growth parameters, such as: temperature, V/III ratio, growth rate, chamber pressure, duration of precursor pulses, type of precursors, and/or the like, can be adjusted to affect the bowing of the substrate to match predicted bowing values. Such a process of measuring bowing and adjusting a composition of the next layer can be repeated any number of times during fabrication of the multi-layer semiconductor structure.

An embodiment of the process can further include masking various regions. For example, a set of masking regions can be placed on a substrate. Subsequently, selective area growth can be performed on the unmasked areas (e.g., 10×10 micron region(s)). Zero or more of the set of masking regions can be removed after the selective growth. Subsequently, a first layer can be grown to have the target effective lattice constant $a_1$ and the process can continue as described herein.

It is understood that the design and growth conditions for the buffer layer 14 and/or the intermediate layer 15 can be further selected based on the type of device (e.g., optoelectronic or electronic) for which the heterostructure is being fabricated. For example, for fabricating a light emitting diode, different buffer and intermediate layer growth conditions will be used depending on a target wavelength to be emitted by the corresponding light emitting diode. In an embodiment, a thickness of the buffer layer and/or an aluminum molar fraction in the intermediate layer can increase as an aluminum molar fraction in the quantum wells of the active region of the device increases. For example, when the light emitting device is configured to emit deep ultraviolet radiation (e.g., having wavelengths in a range between 240-270 nanometers), the thickness of the buffer layer and/or the aluminum molar fraction of the intermediate layer can be larger than those used for a light emitting diode configured to emit radiation having a wavelength in a range between 270-310 nanometers, which requires a smaller aluminum molar fraction in the active region. As an illustrative comparison, for fabricating a light emitting diode configured to operate at 280 nm wavelength, the intermediate layer can comprise a superlattice of alternating AlN/$Al_xGa_{1-x}N$ layers with an aluminum molar fraction x=0.8, whereas for fabricating a light emitting diode configured to operate at 310 nm wavelength, the intermediate layer can comprise a superlattice of alternating AlN/$Al_xGa_{1-x}N$ layers with x less than 0.7.

A heterostructure described herein can be fabricated using any solution. For example, the various semiconductor layers described herein can be grown over a substrate using an epitaxial growth procedure. As described herein, one or more of the growth conditions utilized for a layer can be configured to create a desired property for the layer. For example, when a layer includes a superlattice, the growth conditions of such a superlattice can affect the stresses and strains in the superlattice layers. In particular, such a superlattice can comprise compressive and tensile layers that can further control the distribution of stresses throughout the heterostructure. Furthermore, the tuning of stresses and strains can be achieved by controlling the epitaxial growth parameters of a semiconductor layer. For example, by inducing three-dimensional growth of a semiconductor layer, the resulting layer can exhibit compositional and/or doping concentration inhomogeneities that can affect the resulting stresses and strains within the layer. Furthermore, such inhomogeneities can result in regions that are highly transparent interchanging with regions that are highly conductive, where the term "highly" is understood as being a relative term when comparing the transparent or conductive properties of the different regions within the semiconductor layer.

Figure 14:
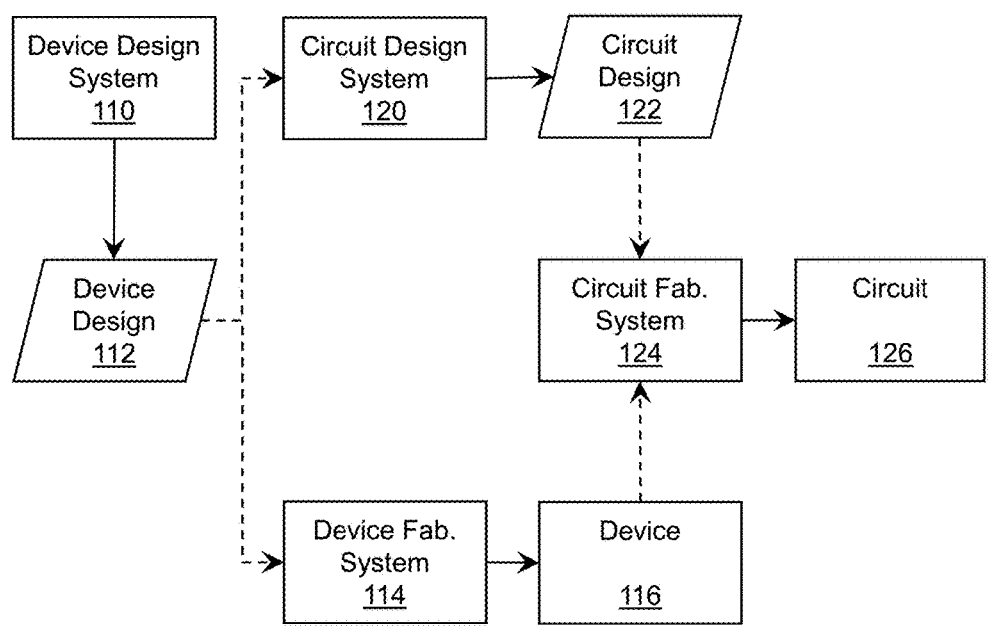
FIG. 14 shows an illustrative flow diagram for fabricating a circuit according to an embodiment.

In one embodiment, the invention provides a method of designing and/or fabricating a circuit that includes one or more of the devices designed and fabricated as described herein. To this extent, FIG. 14 shows an illustrative flow diagram for fabricating a circuit 126 according to an embodiment. Initially, a user can utilize a device design system 110 to generate a device design 112 for a semiconductor device as described herein. The device design 112 can comprise program code, which can be used by a device fabrication system 114 to generate a set of physical devices 116 according to the features defined by the device design 112. Similarly, the device design 112 can be provided to a circuit design system 120 (e.g., as an available component for use in circuits), which a user can utilize to generate a circuit design 122 (e.g., by connecting one or more inputs and outputs to various devices included in a circuit). The circuit design 122 can comprise program code that includes a device designed as described herein. In any event, the circuit design 122 and/or one or more physical devices 116 can be provided to a circuit fabrication system 124, which can generate a physical circuit 126 according to the circuit design 122. The physical circuit 126 can include one or more devices 116 designed as described herein.

In another embodiment, the invention provides a device design system 110 for designing and/or a device fabrication system 114 for fabricating a semiconductor device 116 as described herein. In this case, the system 110, 114 can comprise a general purpose computing device, which is programmed to implement a method of designing and/or fabricating the semiconductor device 116 as described herein. Similarly, an embodiment of the invention provides a circuit design system 120 for designing and/or a circuit fabrication system 124 for fabricating a circuit 126 that includes at least one device 116 designed and/or fabricated as described herein. In this case, the system 120, 124 can comprise a general purpose computing device, which is programmed to implement a method of designing and/or fabricating the circuit 126 including at least one semiconductor device 116 as described herein.

In still another embodiment, the invention provides a computer program fixed in at least one computer-readable medium, which when executed, enables a computer system to implement a method of designing and/or fabricating a semiconductor device as described herein. For example, the computer program can enable the device design system 110 to generate the device design 112 as described herein. To this extent, the computer-readable medium includes program code, which implements some or all of a process described herein when executed by the computer system. It is understood that the term "computer-readable medium" comprises one or more of any type of tangible medium of expression, now known or later developed, from which a stored copy of the program code can be perceived, reproduced, or otherwise communicated by a computing device.

In another embodiment, the invention provides a method of providing a copy of program code, which implements some or all of a process described herein when executed by a computer system. In this case, a computer system can process a copy of the program code to generate and transmit, for reception at a second, distinct location, a set of data signals that has one or more of its characteristics set and/or changed in such a manner as to encode a copy of the program code in the set of data signals. Similarly, an embodiment of the invention provides a method of acquiring a copy of program code that implements some or all of a process described herein, which includes a computer system receiving the set of data signals described herein, and translating the set of data signals into a copy of the computer program fixed in at least one computer-readable medium. In either case, the set of data signals can be transmitted/received using any type of communications link.

In still another embodiment, the invention provides a method of generating a device design system 110 for designing and/or a device fabrication system 114 for fabricating a semiconductor device as described herein. In this case, a computer system can be obtained (e.g., created, maintained, made available, etc.) and one or more components for performing a process described herein can be obtained (e.g., created, purchased, used, modified, etc.) and deployed to the computer system. To this extent, the deployment can comprise one or more of: (1) installing program code on a computing device; (2) adding one or more computing and/or I/O devices to the computer system; (3) incorporating and/or modifying the computer system to enable it to perform a process described herein; and/or the like.

The foregoing description of various aspects of the invention has been presented for purposes of illustration and description. It is not intended to be exhaustive or to limit the invention to the precise form disclosed, and obviously, many modifications and variations are possible. Such modifications and variations that may be apparent to an individual in the art are included within the scope of the invention as defined by the accompanying claims.

What is claimed is:

1. A semiconductor structure comprising:
   a substrate;
   a buffer structure located adjacent to the substrate, the buffer structure including:
      a buffer layer, wherein the buffer layer has a first side adjacent to the substrate, the first side including a plurality of islands of a first nitride-based material laterally separated from any other semiconductor material and a second side opposite the first side at which the islands are coalesced into a single layer of the first nitride-based material, wherein the coalesced portion of the buffer layer has a thickness in a range of approximately 100 Angstroms to approximately 100 microns; and
   a set of semiconductor layers formed adjacent to the buffer structure, wherein the buffer structure is configured such that an overall stress in the set of semiconductor layers at room temperature is compressive and is in a range between approximately 0.1 GPa and 2.0 GPa.

2. The structure of claim 1, wherein the buffer structure further includes an intermediate layer formed of a second nitride-based material located immediately adjacent to the second side of the buffer layer.

3. The structure of claim 2, wherein the intermediate layer comprises a plurality of group III nitride semiconductor sub-layers.

4. The structure of claim 3, wherein the plurality of group III nitride semiconductor sub-layers include:
   a nucleation sub-layer formed directly on the buffer layer, wherein the nucleation sub-layer includes a plurality of nucleation islands; and
   a cavity containing sub-layer formed directly on the nucleation sub-layer, wherein the cavity containing sub-layer includes a plurality of cavities.

5. The structure of claim 4, wherein the plurality of group III nitride semiconductor sub-layers further include a coalescing semiconductor sub-layer formed directly on the cavity containing sub-layer.

6. The structure of claim 3, wherein the plurality of group III nitride semiconductor sub-layers further include:
   a second nucleation sub-layer formed directly on the cavity containing sub-layer, wherein the second nucleation sub-layer includes a second plurality of nucleation islands; and
   a second cavity containing sub-layer formed directly on the second nucleation sub-layer, wherein the second cavity containing sub-layer includes a second plurality of cavities.

7. The structure of claim 1, wherein the set of semiconductor layers includes:
   an n-type layer located immediately adjacent to the buffer structure;
   an active region located on a side of the n-type layer opposite the buffer structure; and
   a p-type layer located on a side of the active region opposite the n-type layer.

8. The structure of claim 1, wherein a surface of the substrate adjacent to the buffer structure is patterned to form a set of protruding regions defined by a set of openings.

9. The structure of claim 8, further comprising a nucleation layer located between the substrate and the buffer structure, wherein the nucleation layer is formed directly on the set of protruding regions and the set of openings include areas with no semiconductor material.

10. The structure of claim 1, wherein the plurality of islands have an average size in a range between approximately 1 nanometer and approximately 100 nanometers and an average spacing in a range between approximately 10 nanometers and approximately 200 nanometers.

11. The structure of claim 1, wherein the plurality of islands have an average height in a range of approximately 5 Angstroms to approximately 100 Angstroms.

12. The structure of claim 1, wherein the buffer layer further includes a second plurality of islands located directly on the single layer, wherein the second plurality of islands are coalesced into a second single layer on a side opposite the single layer.

13. An optoelectronic device comprising:
   a substrate;
   a buffer structure located adjacent to the substrate, the buffer structure including:
      a buffer layer, wherein the buffer layer has a first side adjacent to the substrate, the first side including a plurality of islands of a first semiconductor material laterally separated from any other semiconductor material and a second side opposite the first side at which the islands are coalesced into a single layer, wherein the coalesced portion of the buffer layer has a thickness in a range of approximately 100 Angstroms to approximately 100 microns; and
   a set of semiconductor layers formed adjacent to the buffer structure, wherein the buffer structure is configured such that an overall stress in the set of semiconductor layers at room temperature is compressive and is in a range between approximately 0.1 GPa and 2.0 GPa, wherein the set of semiconductor layers include:
      an n-type layer located on the buffer structure;
      an active region located on a side of the n-type layer opposite the buffer structure; and
      a p-type layer located on a side of the active region opposite the n-type layer.

14. The device of claim 13, wherein the active region is configured to emit ultraviolet radiation.

15. The device of claim 13, wherein the buffer structure further includes an intermediate layer located immediately adjacent to the second side of the buffer layer, wherein the intermediate layer includes a plurality of sub-layers, and wherein the plurality of sub-layers comprise a plurality of group III nitride semiconductor films having alternating tensile and compressive stresses.

16. An optoelectronic device comprising:
   a substrate;
   a nitride-based buffer structure located adjacent to the substrate, the buffer structure including:
      a buffer layer, wherein the buffer layer has a first side including a plurality of islands of a first nitride-based semiconductor material laterally separated from any other semiconductor material and a second side opposite the first side at which the islands are coalesced into a single layer, wherein the coalesced portion of the buffer layer has a thickness in a range of approximately 100 Angstroms to approximately 100 microns; and
      an intermediate layer located immediately adjacent to the second side of the buffer layer, wherein the intermediate layer comprises a plurality of group III nitride-based sub-layers; and
   a set of group III nitride-based semiconductor layers formed adjacent to the intermediate layer, wherein the buffer structure has an effective lattice constant and a thickness such that an overall stress in the set of semiconductor layers at room temperature is compressive and is in a range between approximately 0.1 GPa and 2.0 GPa, wherein the set of semiconductor layers include:
      a group III nitride-based n-type layer located on the buffer structure;
      a group III nitride-based active region located on a side of the n-type layer opposite the buffer structure, wherein the active region is configured to emit ultraviolet radiation; and
      a group III nitride-based p-type layer located on a side of the active region opposite the n-type layer.

17. The device of claim 16, wherein the intermediate layer comprises a plurality of group III nitride sub-layers including:
   a nucleation sub-layer formed directly on the buffer layer, wherein the nucleation sub-layer includes a plurality of nucleation islands; and
   a cavity containing sub-layer formed directly on the nucleation sub-layer, wherein the cavity containing sub-layer includes a plurality of cavities.

18. The device of claim 16, wherein the n-type layer includes a plurality of interlayers, and wherein a frequency of the plurality of interlayers increases towards the active region.

19. The device of claim 13, wherein a surface of the substrate adjacent to the buffer structure is patterned to form a set of protruding regions defined by a set of openings.

20. The device of claim 19, further comprising a nucleation layer located between the substrate and the buffer structure, wherein the nucleation layer is formed directly on the set of protruding regions and the set of openings include areas with no semiconductor material.

* * * * *